United States Patent
Hirata et al.

(10) Patent No.: US 12,386,259 B2
(45) Date of Patent: Aug. 12, 2025

(54) NEGATIVE-TYPE PHOTOSENSITIVE RESIN COMPOSITION AND METHOD FOR PRODUCING POLYIMIDE AND CURED RELIEF PATTERN USING SAME

(71) Applicant: ASAHI KASEI KABUSHIKI KAISHA, Tokyo (JP)

(72) Inventors: Tatsuya Hirata, Tokyo (JP); Kohei Murakami, Tokyo (JP); Takanobu Fujioka, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 1071 days.

(21) Appl. No.: 17/260,811

(22) PCT Filed: Jul. 18, 2019

(86) PCT No.: PCT/JP2019/028340
§ 371 (c)(1),
(2) Date: Jan. 15, 2021

(87) PCT Pub. No.: WO2020/026840
PCT Pub. Date: Feb. 6, 2020

(65) Prior Publication Data
US 2021/0294213 A1   Sep. 23, 2021

(30) Foreign Application Priority Data

Jul. 31, 2018 (JP) .................. 2018-143610
Aug. 6, 2018 (JP) .................. 2018-147982
Dec. 26, 2018 (JP) .................. 2018-243228

(51) Int. Cl.
| | | |
|---|---|---|
| G03F 7/038 | (2006.01) | |
| G03F 7/004 | (2006.01) | |
| G03F 7/32 | (2006.01) | |
| G03F 7/40 | (2006.01) | |

(52) U.S. Cl.
CPC .......... *G03F 7/0382* (2013.01); *G03F 7/0045* (2013.01); *G03F 7/0387* (2013.01); *G03F 7/325* (2013.01); *G03F 7/40* (2013.01)

(58) Field of Classification Search
None
See application file for complete search history.

(56) References Cited

U.S. PATENT DOCUMENTS

| | | |
|---|---|---|
| 5,028,683 A | 7/1991 | Martens et al. |
| 5,300,530 A | 4/1994 | Machado et al. |
| 5,472,823 A | 12/1995 | Hagiwara et al. |
| 8,399,569 B2 * | 3/2013 | Murofushi ......... C08G 18/3206 525/291 |
| 2001/0048166 A1 | 12/2001 | Miyazaki |
| 2005/0170285 A1 * | 8/2005 | Sugasaki ................ G03F 7/035 430/286.1 |
| 2005/0244739 A1 * | 11/2005 | Kanatani .................. G03F 7/035 430/270.1 |
| 2013/0004897 A1 | 1/2013 | Shiraishi |
| 2015/0203707 A1 * | 7/2015 | Klun ...................... B05D 3/101 428/425.9 |
| 2017/0285473 A1 * | 10/2017 | Uno ........................ G03F 7/027 |
| 2018/0275513 A1 * | 9/2018 | Takemura ............ C09D 179/08 |
| 2018/0361774 A1 | 12/2018 | Aizu et al. |

FOREIGN PATENT DOCUMENTS

| | | |
|---|---|---|
| CN | 102763038 A | 10/2012 |
| JP | H05-301959 | 11/1993 |
| JP | H07-309816 | 11/1995 |
| JP | 2001-338947 | 12/2001 |
| JP | 2009009107 A * | 1/2009 |
| JP | 2012-194520 | 10/2012 |

(Continued)

OTHER PUBLICATIONS

Translated application of Fujita et al (Year: 2012).*
Translated Description of Kamemoto (Year: 2009).*
ISR issued in WIPO Patent Application No. PCT/JP2019/028340, dated Oct. 15, 2019, English translation.
WO/ISA issued in WIPO Patent Application No. PCT/JP2019/028340, dated Oct. 15, 2019, English translation.
IPRP issued in WIPO Patent Application No. PCT/JP2019/028340, issued Feb. 2, 2021, English translation.

*Primary Examiner* — Jonathan Johnson
*Assistant Examiner* — Andrew Preston Traywick
(74) *Attorney, Agent, or Firm* — GREENBLUM & BERNSTEIN, P.L.C.

(57) ABSTRACT

Provided are a negative photosensitive resin composition and a method for forming a cured relief pattern using the same with which a high chemical resistance and resolution can be obtained and in which the occurrence of voids in the interface of a Cu layer contacting a resin layer after high-temperature storage evaluation can be suppressed. Provided is a negative photosensitive resin composition including (A) a polyimide precursor represented by general formula (1) below; (B) a compound having at least one selected from a urethane bond and a urea bond; and (C) a photopolymerization initiator. In the formula, $X_1$, $Y_1$, $n_1$, $R_1$, and $R_2$ are each as defined in the description of the present application.

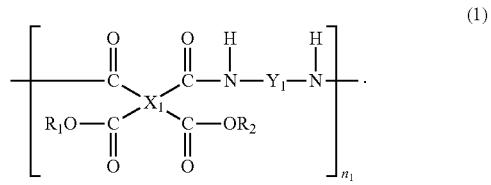

(1)

30 Claims, No Drawings

(56) References Cited

FOREIGN PATENT DOCUMENTS

| | | | |
|---|---|---|---|
| JP | 2013-053236 A | 3/2013 | |
| JP | 2016-210912 A | 12/2016 | |
| JP | 2017-194677 | 10/2017 | |
| KR | 20120023545 A1 * | 3/2012 | ............... G03F 7/00 |
| WO | 2017/131037 | 8/2017 | |
| WO | 2017/150039 | 9/2017 | |
| WO | 2017/209177 | 12/2017 | |
| WO | 2018/038001 | 3/2018 | |

* cited by examiner

NEGATIVE-TYPE PHOTOSENSITIVE RESIN COMPOSITION AND METHOD FOR PRODUCING POLYIMIDE AND CURED RELIEF PATTERN USING SAME

FIELD

The present invention relates to a negative photosensitive resin composition and methods for the production of a polyimide and a cured relieve pattern using the same.

BACKGROUND

Conventionally, polyimide resins, polybenzoxazole resins, phenol resins, etc., which have excellent heat resistance, electrical properties, and mechanical properties, have been used as insulating materials for electronic components and passivation films, surface protective films, and interlayer insulating films of semiconductor devices. Among these resins, those provided in the form of a photosensitive resin composition can be used to easily form a heat resistance relief pattern film by thermal imidization treatment by applying, exposing, developing, and curing the composition. Such photosensitive resin compositions are characterized in that significant process reductions can be achieved as compared with conventional non-photosensitive materials.

Semiconductor devices (hereinafter, also referred to as "elements") are mounted on a printed substrate by various methods in accordance with application. Conventional elements have generally been produced by a wire bonding method in which thin wire is used to connect an external terminal (pad) of the element to a lead frame. However, in recent years, the speeds of elements have been increased, and the operating frequency has reached GHz levels. Thus, the different wiring lengths of terminals in mounting affect the operation of the element. Therefore, in the mounting of elements for high-end applications, it is necessary to accurately control the length of the mounting wiring, and it is difficult to meet the demand by wire bonding.

Thus, flip-chip mounting has been proposed in which a rewiring layer is formed on the surface of a semiconductor chip, bumps (electrodes) are formed on thereon, and the chip is then flipped and mounted directly on a printed substrate (refer to, for example, Patent Literature 1). Since wiring distance can be accurately controlled, flip-chip mounting is used in high-end devices which handle high-speed signals or in mobile phones due to the small mounting size thereof, and demand therefor is rapidly expanding. When a material such as polyimide, polybenzoxazole, or phenol resin is used for flip-chip mounting, a metal wiring layer forming step is performed after the pattern of the resin layer is formed. Conventionally, the surface of the resin layer is plasma-etched to roughen the surface, a metal layer serving as a seed layer for plating is then formed by sputtering with a thickness of 1 μm or less, and the metal wiring layer is formed by performing electrolytic plating using the metal layer as an electrode. At this time, titanium (Ti) is generally used as the metal serving as the seed layer, and copper (Cu) is used as the metal of the rewiring layer formed by electroplating.

It is necessary that such a metal rewiring layer have high adhesion between the rewired metal layer and the resin layer after reliability evaluation. Examples of the reliability evaluation include high-temperature storage evaluation of storage in air at a high temperature of 125° C. or higher for 100 hours or longer; high-temperature operation evaluation to confirm operation in air at a temperature of approximately 125° C. for 100 hours or longer while voltage is applied after wiring is arranged; temperature cycle evaluation in which a low-temperature state of approximately −65° C. to −40° C. and a high temperature state of approximately 125° C. to 150° C. are alternatingly cycled in air; high-temperature and high-humidity storage evaluation of storage at a temperature of 85° C. or higher and in a water vapor atmosphere with a humidity of 85% or higher; high-temperature and high-humidity bias evaluation in which the same test as the high-temperature and high-humidity storage evaluation is performed while voltage is applied after wiring is arranged; and solder reflow evaluation in which the device is passed a plurality of times through a 260° C. solder reflow oven in an air or nitrogen atmosphere.

CITATION LIST

Patent Literature

[PTL 1] Japanese Unexamined Patent Publication (Kokai) No. 2001-338947

SUMMARY OF INVENTION

Technical Problem

However, conventionally, among the above reliability evaluations, in the case of high-temperature storage evaluation, there is a problem that voids are generated at the interface of the rewired Cu layer contacting the resin layer after evaluation. If voids are generated at the interface between the Cu layer and the resin layer, the adhesion between the two is reduced.

In addition to the void problem, chemical resistance is required of the rewired metal layer, and miniaturization requirements are also increasing. Thus, in particular, it is necessary that the photosensitive resin composition used for forming the rewiring layer of a semiconductor be capable of suppressing the generation of voids and exhibit high chemical resistance and resolution.

The present invention has been conceived of in light of such circumstances of the prior art, and an object thereof is to provide a negative photosensitive resin composition (hereinafter, sometimes also referred to simply as a "photosensitive resin composition") with which high chemical resistance and resolution can be obtained, and the generation of voids can be suppressed at the interface of the Cu layer contacting the resin layer after high temperature storage evaluation. Furthermore, an object is to provide a method for forming a cured relief pattern using the negative photosensitive resin composition of the present invention.

In recent years, fan-out semiconductor packages have been attracting attention. In a fan-out semiconductor package, a chip encapsulant larger than the chip size of the semiconductor chip is formed by covering the semiconductor chip with an encapsulating material. Further, a rewiring layer extending to the area of the semiconductor chip and the encapsulating material is formed. The rewiring layer is formed with a thin film thickness. Further, since the rewiring layer can be formed up to the area of the encapsulating material, the number of external connection terminals can be increased. Fan-out semiconductor packages require a further reduction in curing temperature, and as a result, the adhesion to an encapsulating material such as a mold resin is reduced, and as such, further improvement is required.

Solution to Problem

The present inventors have discovered that by combining a polyimide precursor having a specific structure, a (meth)

acrylate having a specific structure, and a photopolymerization initiator, the above problems can be solved, and have conceived of the present invention. Examples of the embodiments of the present invention are described below.

[1]

A negative photosensitive resin composition, comprising:
(A) a polyimide precursor represented by general formula (1) below,
(B) a compound having at least one selected from a urethane bond and a urea bond, and
(C) a photopolymerization initiator:

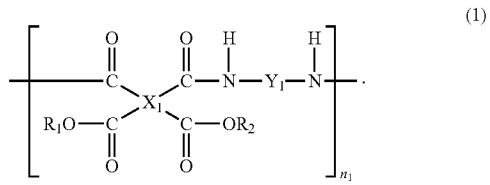

(1)

where $X_1$ is a tetravalent organic group, $Y_1$ is a divalent organic group, $n_1$ is an integer of 2 to 150, $R_1$ and $R_2$ are each independently a hydrogen atom or a monovalent organic group, and at least one of $R_1$ and $R_2$ is a monovalent organic group represented by general formula (2) below:

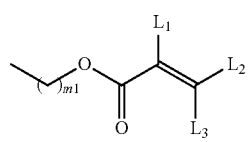

(2)

where $L_1$, $L_2$, and $L_3$ are each independently a hydrogen atom or a $C_{1-3}$ organic group, and $m_1$ is an integer of 2 to 10.

[2]

The negative photosensitive resin composition according to Item 1, wherein the (B) compound is a compound having a urea bond.

[3]

The negative photosensitive resin composition according to Item 1 or 2, wherein the (B) compound further has at least one functional group selected from a (meth)acrylic group, hydroxyl group, alkoxy group, and amino group.

[4]

The negative photosensitive resin composition according to any one of Items 1 to 3, wherein the (B) compound is a compound having a (meth)acrylic group and a urea bond, and the (meth)acrylic equivalent thereof is 150 to 400 g/mol.

[5]

The negative photosensitive resin composition according to any one of Items 1 to 3, wherein the (B) compound is a compound having a (meth)acrylic group and a urea bond, and the (meth)acrylic equivalent thereof is 210 to 400 g/mol.

[6]

The negative photosensitive resin composition according to any one of Items 1 to 3, wherein the (B) compound is a compound having a (meth)acrylic group and a urea bond, and the (meth)acrylic equivalent thereof is 220 to 400 g/mol.

[7]

The negative photosensitive resin composition according to any one of Items 1 to 6, wherein the (B) compound contains a structure represented by general formula (3) below:

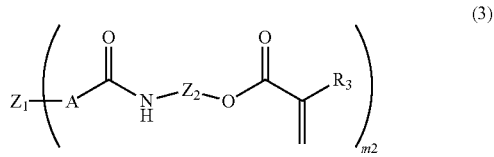

(3)

where $R_3$ is a hydrogen atom or methyl group, A is a group selected from the group consisting of —O—, —NH—, and —NL$_4$-, $L_4$ is a $C_{1-12}$ monovalent organic group, $Z_1$ is a $C_{2-24}$ organic group having a valency of $m_2$, $Z_2$ is a $C_{2-8}$ divalent organic group, and $m_2$ is an integer of 1 to 3.

[8]

The negative photosensitive resin composition according to any one of Items 1 to 7, wherein the (B) compound further contains a (meth)acrylic group and at least one functional group selected from hydroxyl group, alkoxy group, and amino group.

[9]

The negative photosensitive resin composition according to any one of Items 1 to 8, wherein the (B) compound is at least one compound selected from the group consisting of general formulas (4) to (7) and (11) to (14) below:

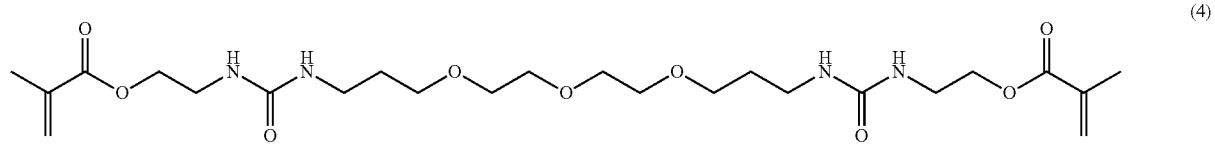

(4)

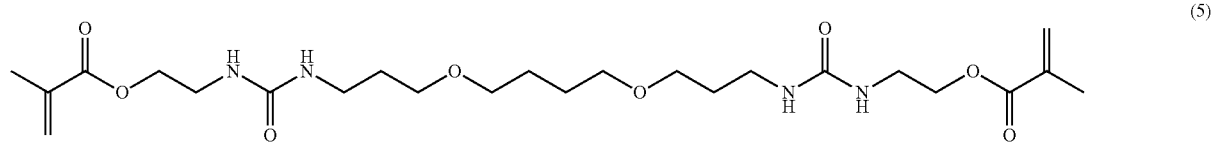

(5)

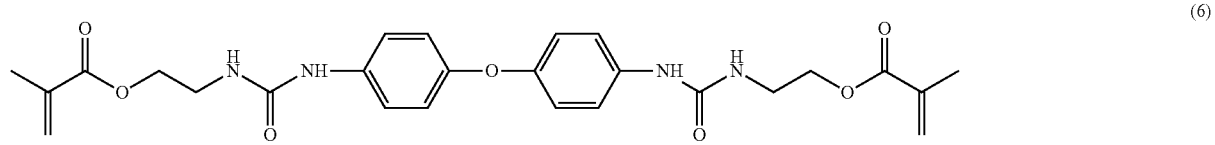

(6)

-continued

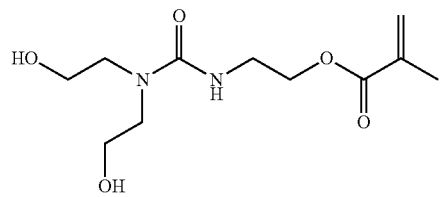 (7)

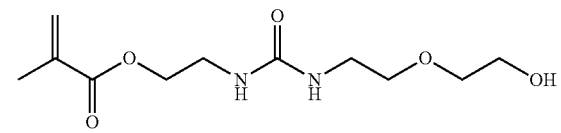 (11)

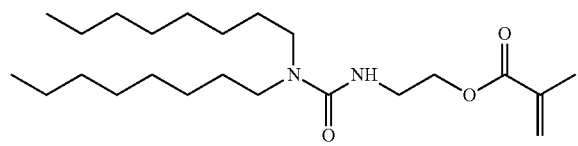 (12)

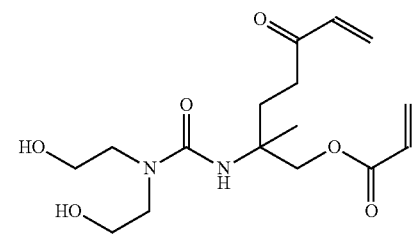 (13)

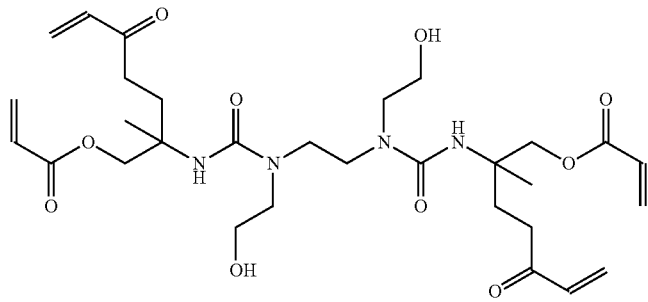 (14)

[10]
The negative photosensitive resin composition according to any one of Items 1 to 9, further comprising (D) a corrosion inhibitor.

[11]
The negative photosensitive resin composition according to Item 10, wherein the (D) corrosion inhibitor contains a nitrogen-containing heterocyclic compound.

[12]
The negative photosensitive resin composition according to Item 11, wherein the nitrogen-containing heterocyclic compound is an azole compound.

[13]
The negative photosensitive resin composition according to Item 11, wherein the nitrogen-containing heterocyclic compound is a purine derivative.

[14]
The negative photosensitive resin composition according to any one of Items 1 to 13, further comprising (E) a silane coupling agent.

[15]
The negative photosensitive resin composition according to any one of Items 1 to 14, wherein $X_1$ of the (A) polyimide precursor contains at least one selected from the group consisting of general formulas (20a), (20b), and (20c) below:

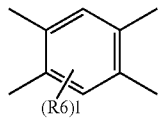 (20a)

-continued

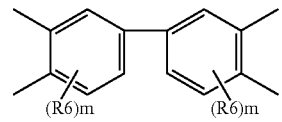 (20b)

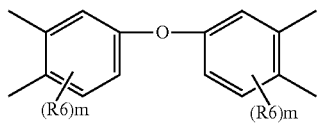 (20c)

where $R_6$ are each independently a monovalent group selected from the group consisting of a hydrogen atom, fluorine atom, $C_{1-10}$ hydrocarbon group, and $C_{1-10}$ fluorine-containing hydrocarbon group, l is an integer selected from 0 to 2, and m is an integer selected from 0 to 3.

[16]
The negative photosensitive resin composition according to any one of Items 1 to 15, wherein $Y_1$ of the (A) polyimide precursor contains at least one selected from the group consisting of general formulas (21a), (21b), and (21c) below:

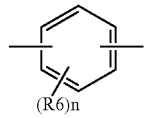 (21a)

-continued

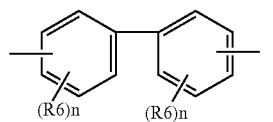
(21b)

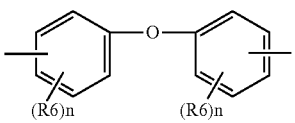
(21c)

where $R_6$ are each independently a monovalent group selected from the group consisting of a hydrogen atom, fluorine atom, $C_{1-10}$ hydrocarbon group, and $C_{1-10}$ fluorine-containing hydrocarbon group, and n is an integer selected from 0 to 4.

[17]
The negative photosensitive resin composition according to any one of Items 1 to 16, wherein the (A) polyimide precursor comprises a polyimide precursor having a structural unit represented by general formula (8) below:

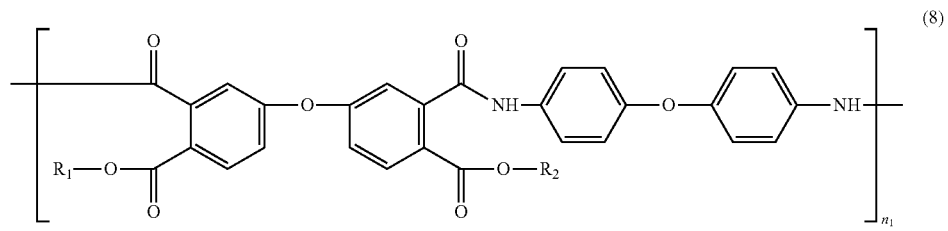
(8)

where $n_1$ is an integer of 2 to 150 and $R_1$ and $R_2$ are each independently a hydrogen atom or a monovalent group.

[18]
The negative photosensitive resin composition according to any one of Items 1 to 17, wherein the (A) polyimide precursor comprises a polyimide precursor having a structural unit represented by general formula (9) below:

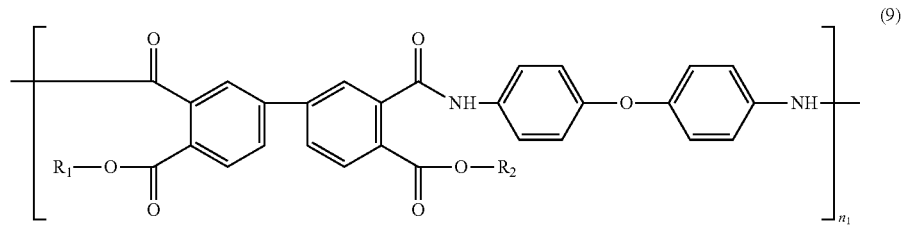
(9)

where $n_1$ is an integer of 2 to 150, and $R_1$ and $R_2$ are each independently a hydrogen atom or a monovalent organic group.

[19]
The negative photosensitive resin composition according to any one of Items 1 to 18, wherein the (A) polyimide precursor is a copolymer of a structural unit represented by general formula (8) below:

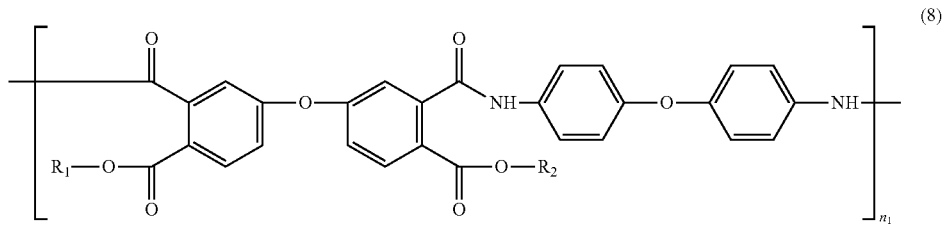

where $n_1$ is an integer of 2 to 150 and $R_1$ and $R_2$ are each independently a hydrogen atom or a monovalent organic group, and $R_1$, $R_2$, and $n_1$ may be the same as or different than $R_1$, $R_2$, and $n_1$ of general formula (9), and a structural unit represented by general formula (9) below:

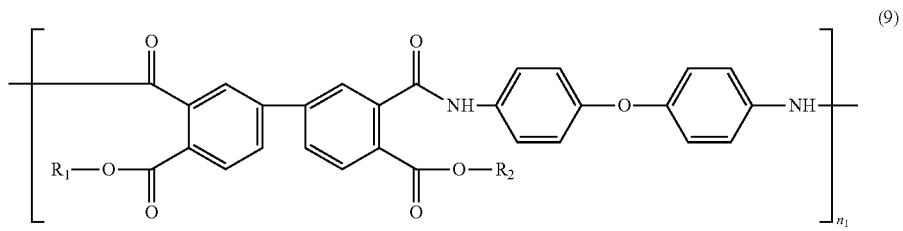

where $n_1$ is an integer of 2 to 150 and $R_1$ and $R_2$ are each independently a hydrogen atom or a monovalent organic group, and $R_1$, $R_2$, and $n_1$ may be the same as or different than $R_1$, $R_2$, and $n_1$ of general formula (8), or a mixture of a polyimide precursor having a structural unit represented by general formula (8) above, and a polyimide precursor having a structural unit represented by general formula (9) above.

[20]

The negative photosensitive resin composition according to Item 19, wherein the (A) polyimide precursor is a copolymer of a structural unit represented by general formula (8) above and a structural unit represented by general formula (9) above.

[21]

The negative photosensitive resin composition according to any one of Items 1 to 20, comprising:
  100 parts by weight of the (A) polyimide precursor,
  0.1 to 30 parts by weight of the (B) compound relative to 100 parts by weight of the (A) polyimide precursor, and
  0.1 to 20 parts by weight of the (C) photopolymerization initiator relative to 100 parts by weight of the (A) polyimide precursor.

[22]

A method for the production of a polyimide, comprising a step of converting the negative photosensitive resin composition according to any one of Items 1 to 21 into a polyimide.

[23]

A method for the production of a cured relief pattern, comprising the steps of:
  (1) applying the negative photosensitive resin composition according to any one of Items 1 to 21 onto a substrate to form a photosensitive resin layer on the substrate,
  (2) exposing the photosensitive resin layer,
  (3) developing the exposed photosensitive resin layer to form a relief pattern, and
  (4) heat-treating the relief pattern to form a cured relief pattern.

[24]

A compound represented by formula (5) below:

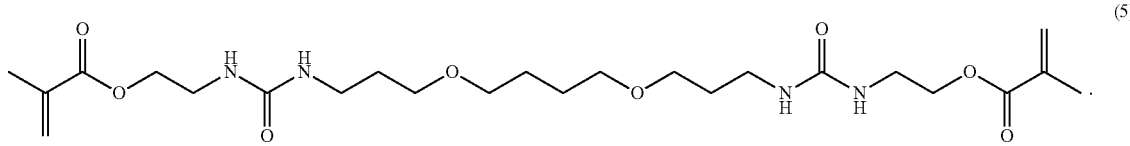

[25] A compound represented by formula (6) below:

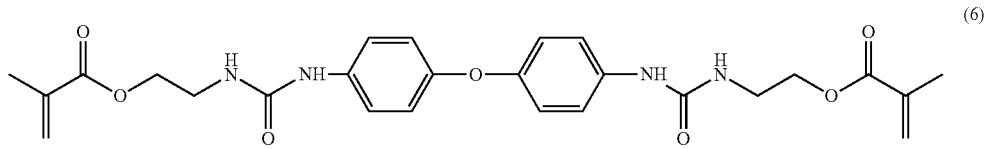 [SMILES: C=C(C)C(=O)OCCNC(=O)Nc1ccc(Oc2ccc(NC(=O)NCCOC(=O)C(=C)C)cc2)cc1]

[26] A compound represented by formula (7) below:

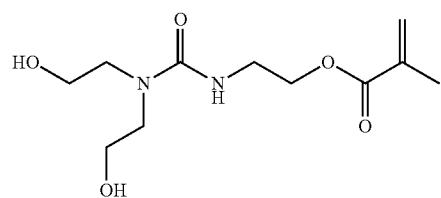

[27] A compound represented by formula (11) below:

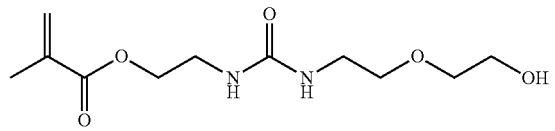

[28] A compound represented by formula (12) below:

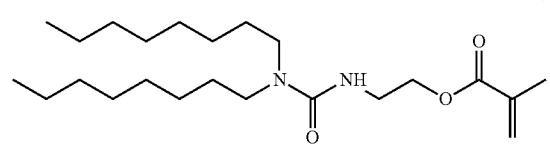

[29] A compound represented by formula (13) below:

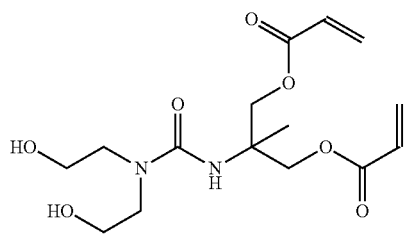

[30] A compound represented by formula (14) below:

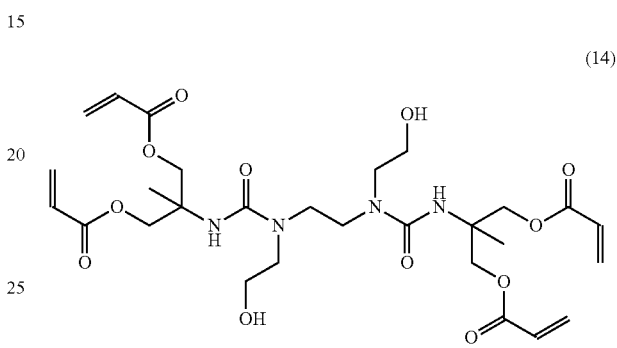

Advantageous Effects of Invention

According to the present invention, there can be provided a negative photosensitive resin composition with which a high chemical resistance and resolution can be obtained, and with which the generation of voids at the interface of the Cu layer that contacts the resin layer after high temperature storage evaluation can be suppressed, and there can be provided a method for the formation of a cured relief pattern using the negative photosensitive resin composition. Furthermore, according to the present invention, there can be provided a negative photosensitive resin composition which has suitable adhesion with mold resin, which is used in fan-out semiconductor packages.

DESCRIPTION OF EMBODIMENTS

The modes for carrying out the present invention (hereinafter referred to as the "present embodiments") will be described in detail below. It should be noted that the present invention is not limited to the present embodiments below, and various changes can be made within the scope of the gist thereof. Throughout the specification, structures represented by the same reference signs in the general formulas may be the same as or different than each other when a plurality of structures are present in a molecule.

<Negative Photosensitive Resin Composition>

The negative photosensitive resin composition according to the present embodiment comprises (A) a polyimide precursor; (B) a compound having at least one selected from a urethane bond and a urea bond, and (C) a photopolymerization initiator.

From the viewpoint of obtaining a high chemical resistance, it is preferable that the negative photosensitive resin composition comprise 100 parts by weight of the (A) polyimide precursor, 0.1 to 30 parts by weight of the (B) compound relative to 100 parts by weight of the (A) polyimide precursor, and 0.1 to 20 parts by weight of the (C) photopolymerization initiator relative to 100 parts by weight of the (A) polyimide precursor.

(A) Polyimide Precursor

The (A) polyimide precursor of the present embodiment is a resin component contained in the negative photosensitive resin composition, and is converted to a polyimide by being subjected to a heat cyclization treatment. The polyimide precursor is a polyamide having a structure represented by general formula (1) below:

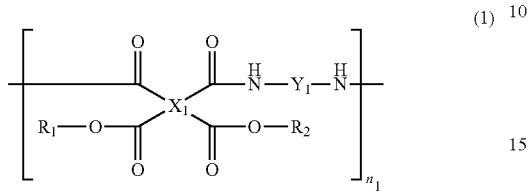

where $X_1$ is a tetravalent organic group, $Y_1$ is a divalent organic group, $n_1$ is an integer of 2 to 150, $R_1$ and $R_2$ are each independently a hydrogen atom or a monovalent organic group.

At least one of $R_1$ and $R_2$ is a monovalent organic group represented by general formula (2) below:

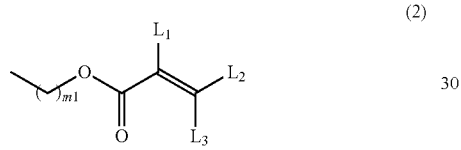

where $L_1$, $L_2$, and $L_3$ are each independently a hydrogen atom or a $C_{1-3}$ organic group, and $m_1$ is an integer of 2 to 10.

$n_1$ in general formula (1) is not particularly limited as long as it is an integer of 2 to 150, and from the viewpoints of the photosensitivity and mechanical properties of the negative photosensitive resin composition, an integer of 3 to 100 is preferable, and an integer of 5 to 70 is more preferable. In general formula (1), the tetravalent organic group represented by $X_1$ is, in terms of achieving both heat resistance and photosensitivity, preferably a $C_{6-40}$ organic group, and more preferably, is an aromatic group or an alicyclic aliphatic group in which the —$COOR_1$ group, the —$COOR_2$ group and the —CONH— group are in the ortho positions relative to each other. Specific examples of the tetravalent organic group represented by $X_1$ include $C_{6-40}$ organic groups having an aromatic ring and groups having a structure represented by general formula (20) below, though the tetravalent organic group represented by $X_1$ is not limited thereto:

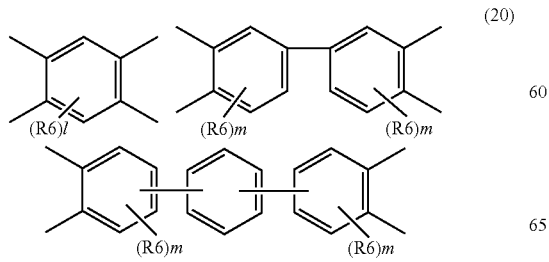

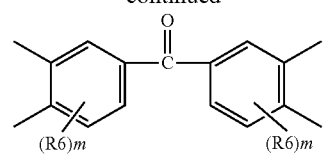

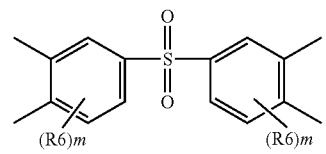

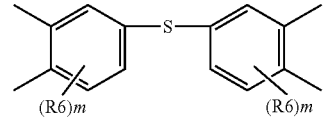

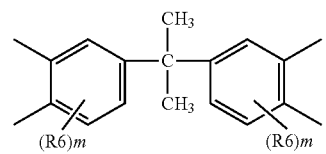

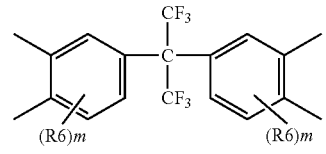

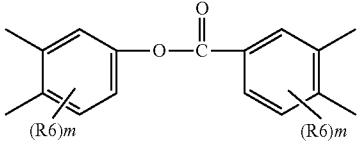

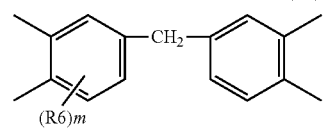

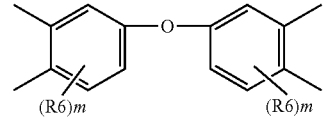

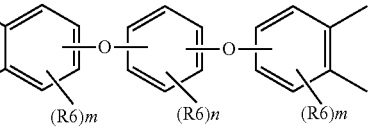

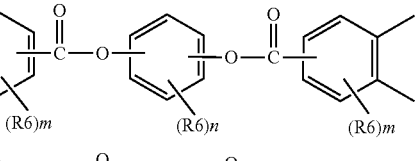

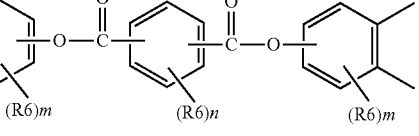

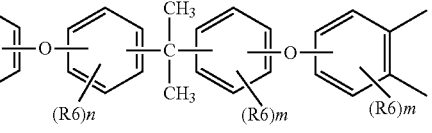

-continued

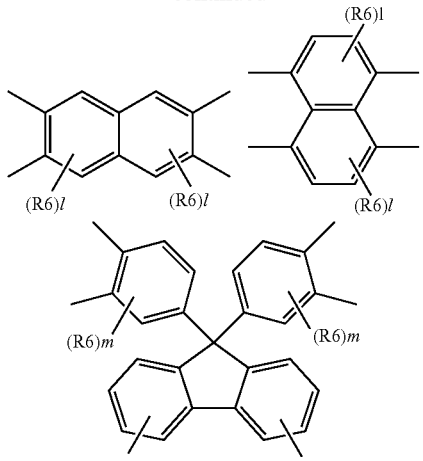

where $R_6$ is a monovalent group selected from the group consisting of a hydrogen atom, a fluorine atom, a $C_{1-10}$ hydrocarbon group, and a $C_{1-10}$ fluorine-containing hydrocarbon group, l is an integer selected from 0 to 2, m is an integer selected from 0 to 3, and n is an integer selected from 0 to 4.

The structure of $X_1$ may be one type or a combination of two or more types. The $X_1$ group having the structure represented by formula (20) above is particularly preferable in terms of achieving both heat resistance and photosensitivity. As the $X_1$ group, among the structures represented by formula (20) above, in particular the structures represented by formulas (20a), (20b), and (20c) below are particularly preferable from the viewpoints of chemical resistance, resolution, and the suppression of voids after high-temperature storage evaluation:

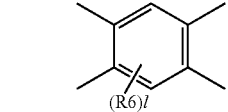
(20a)

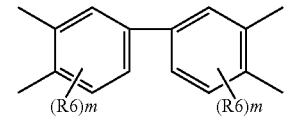
(20b)

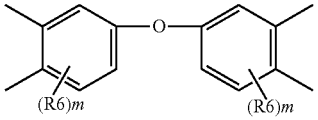
(20c)

where $R_6$ are each independently a monovalent group selected from the group consisting of a hydrogen atom, fluorine atom, $C_{1-10}$ hydrocarbon group, and $C_{1-10}$ fluorine-containing hydrocarbon group, l is an integer selected from 0 to 2, m is an integer selected from 0 to 3, and n is an integer selected from 0 to 4; $R_6$ of general formulas (20a) to (20c) may be the same as $R_6$ of general formulas (21a) to (21c), which are described later, or may be different.

In general formula (1) above, the divalent organic group represented by $Y_1$ is, in terms of achieving both heat resistance and photosensitivity, preferably a $C_{6-40}$ aromatic group, and examples thereof include the structures represented by formula (21) below, though the divalent organic group represented by $Y_1$ is not limited thereto:

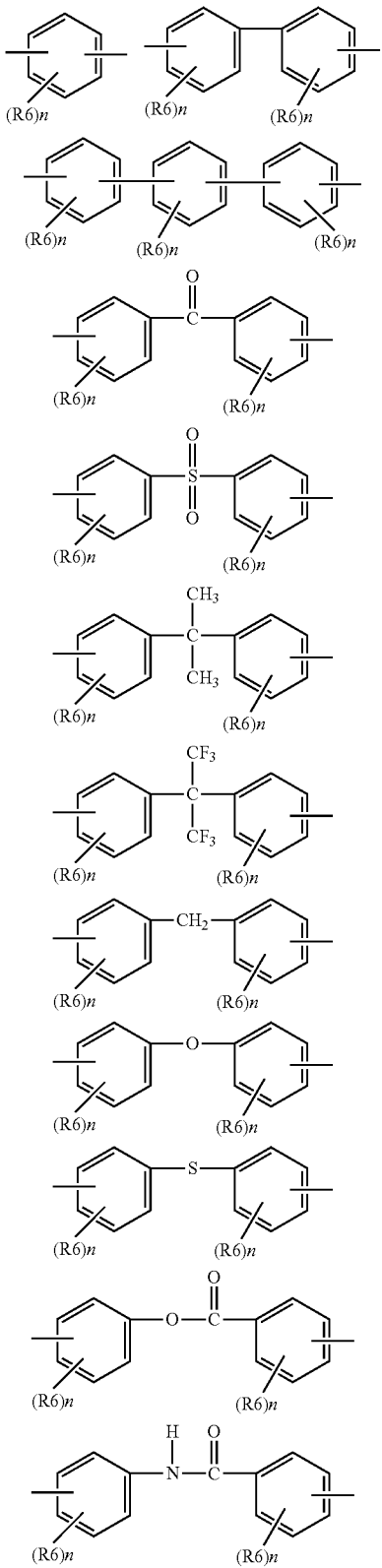
(21)

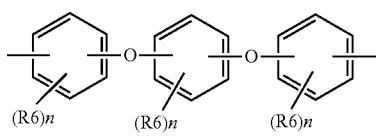
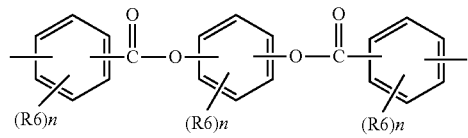
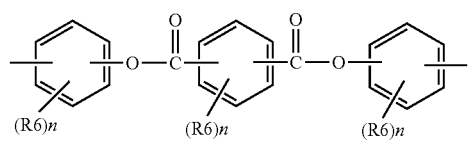
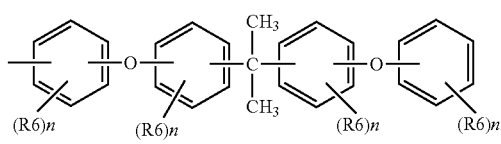
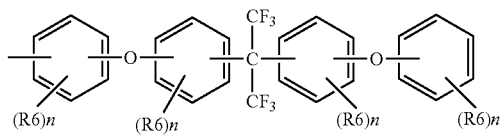
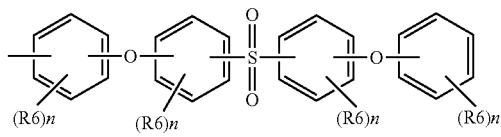
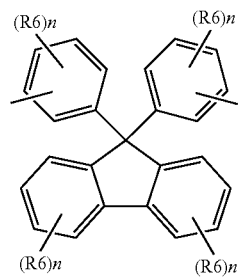
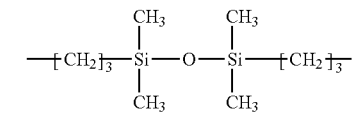
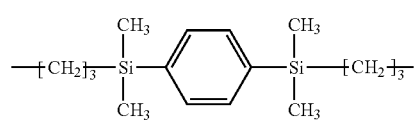

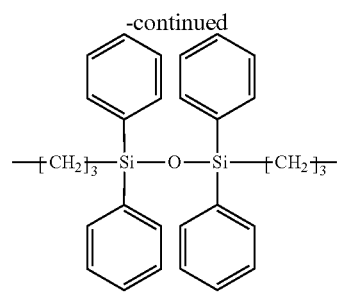

where $R_6$ is a monovalent group selected from the group consisting of a hydrogen atom, fluorine atom, a $C_{1\text{-}10}$ hydrocarbon group, and a $C_{1\text{-}10}$ fluorine-containing hydrocarbon group, and n is an integer selected from 0 to 4.

The structure of $Y_1$ may be of a single type or may be a combination or two or more types. The $Y_1$ group having the structure represented by formula (21) above is particularly preferable in terms of achieving both heat resistance and photosensitivity. As the $Y_1$ group, particularly among the structures represented by formula (21) above, the structures represented by formulas (21a), (21b), and (21c) below are particularly preferable from the viewpoints of chemical resistance, resolution, and void suppression after high-temperature storage evaluation:

(21a)

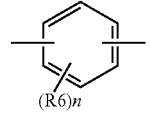

(21b)

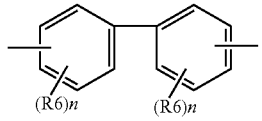

(21c)

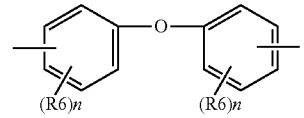

where $R_6$ is a monovalent group selected from the group consisting of a hydrogen atom, fluorine atom, $C_{1\text{-}10}$ hydrocarbon group, and $C_{1\text{-}10}$ fluorine-containing hydrocarbon group, and n is an integer selected from 0 to 4; $R_6$ of general formulas (21a) to (21c) may be the same as the $R_6$ of general formulas (20a) to (20c) described above, or may be different.

$L_1$ in general formula (2) above is preferably a hydrogen atom or methyl group, and $L_2$ and $L_3$ are preferably a hydrogen atom from the viewpoint of photosensitivity. Furthermore, m1 is an integer of 2 to 10 from the viewpoint of photosensitivity, and is preferably an integer of 2 to 4.

In an embodiment, the (A) polyamide precursor is preferably a polyimide precursor having a structural unit represented by general formula (8) below:

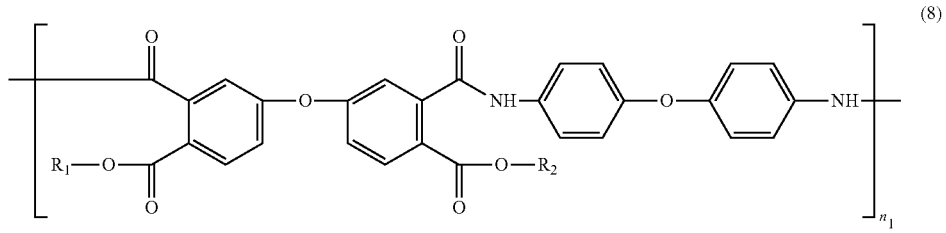

where $R_1$, $R_2$, and $n_1$ are defined as described above. In general formula (8), it is more preferable that at least one of $R_1$ and $R_2$ be a monovalent organic group represented by general formula (2) above. As a result of the (A) polyimide precursor comprising a polyimide precursor having a structural unit represented by general formula (8), in particular, the effect on resolution is high.

In an embodiment, the (A) polyimide precursor is preferably a polyimide precursor having a structural unit represented by general formula (9) below:

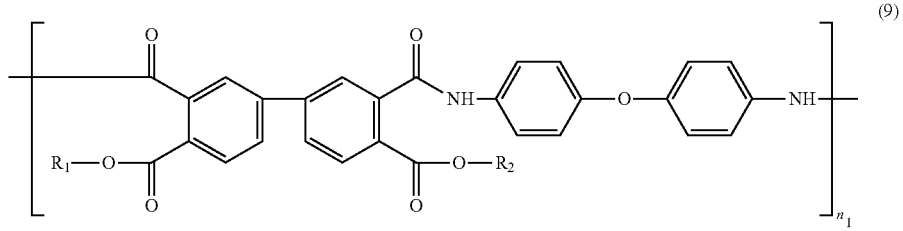

where $R_1$, $R_2$, and $n_1$ are defined as described above.

In general formula (9), it is preferable that at least one of $R_1$ and $R_2$ be a monovalent organic group represented by general formula (2) above. By including a polyimide precursor having a structural unit represented by general formula (9) in addition to a polyimide precursor represented by general formula (8), in particular, the effect on resolution is high.

It is particularly preferable from the viewpoints of chemical resistance, resolution, and void suppression after high-temperature storage evaluation that the (A) polyimide precursor be a mixture of a polyimide precursor having a structural unit represented by general formula (8) and a polyimide precursor having a structural unit represented by general formula (9) or a copolymer of a structural unit represented by general formula (8) above and a structural unit represented by general formula (9) above. In general formulas (8) and (9), the $R_1$, $R_2$, and $n_1$ of one of the formulas may be the same as the $R_1$, $R_2$, and $n_1$ of the other formula, or may be different.

(A) Polyimide Precursor Preparation Method

The (A) polyimide precursor is obtained by first reacting a tetracarboxylic dianhydride having the aforementioned tetravalent organic group $X_1$ with an alcohol having a photopolymerizable unsaturated double bond and optionally an alcohol having no unsaturated double bond to prepare a partially esterified tetracarboxylic acid (hereinafter, also referred to as an acid/ester body), and then subjecting this to amide polycondensation with a diamine containing the aforementioned divalent organic group $Y_1$.

(Preparation of Acid/Ester Body)

In the present embodiment, examples of the tetracarboxylic dianhydride containing a tetravalent organic group $X_1$ which is suitably used for the preparation of the (A) polyimide precursor include tetracarboxylic dianhydrides shown in the general formula (20) above, for example, pyromellitic anhydride, diphenyl ether-3,3',4,4'-tetracarboxylic dianhydride, benzophenone-3,3',4,4'-tetracarboxylic dianhydride, 4,4'-oxydiphthalic dianhydride (ODPA), 3,3',4,4'-biphenyltetracarboxylic dianhydride (BPDA), diphenylsulfone-3,3',4,4'-tetracarboxylic dianhydride, diphenylmethane-3,3',4,4'-tetracarboxylic dianhydride, 2,2-bis(3,4-phthalic anhydride)propane, and 2,2-bis(3,4-phthalic anhydride)-1,1,1,3,3,3-hexafluoropropane. Preferred examples include but are not limited to pyromellitic anhydride, diphenyl ether-3,3',4,4'-tetracarboxylic dianhydride, benzophenone-3,3',4,4'-tetracarboxylic dianhydride, 4,4'-oxydiphthalic dianhydride (ODPA), 3,3',4,4'-biphenyltetracarboxylic dianhydride (BPDA). Furthermore, these may be used alone or two or more types thereof may be mixed and used.

In the present embodiment, examples of the alcohol having a photopolymerizable unsaturated double bond which is suitably used for preparation of the (A) polyimide precursor include 2-hydroxyethylmethacrylate (HEMA), 2-acryloyloxyethyl alcohol, 1-acryloyloxy-3-propyl alcohol, 2-acrylicamideethyl alcohol, methylol vinyl ketone, 2-hydroxyethylvinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamide ethyl alcohol, methylol vinyl ketone, 2-hydroxy-3-methoxypropylmethacrylate, 2-hydroxy-3-butoxypropylmethacrylate, 2-hydroxy-3-phenoxypropylmethacrylate, 2-hydroxy-3-butoxypropylmethacrylate, 2-hydroxy-3-t-butoxypropylmethacrylate, and 2-hydroxy-3-cyclohexyloxypropylmethacrylate To the above alcohol having a photopolymerizable unsaturated double bond, an alcohol having no unsaturated double bond such as, for example, methanol, ethanol, n-propanol, isopropanol, n-butanol, tert-butanol, 1-pentanol, 2-pentanol, 3-pentanol, neopentyl alcohol, 1-heptanol, 2-heptanol, 3-heptanol, 1-octanol, 2-octanol, 3-octanol, 1-nonanol, triethyleneglycol monomethyl ether, triethyleneglycol monoethyl ether, tetraethyleneglycol monomethyl ether, tetraethyleneglycol monoethyl ether, and benzyl alcohol can be mixed and used.

Further, a non-photosensitive polyimide precursor prepared with only an alcohol having no unsaturated double bond described above may be mixed with a photosensitive polyimide precursor and used as the polyimide precursor. From the viewpoint of resolution, the non-photosensitive polyimide precursor is preferably 200 parts by weight or less with respect to 100 parts by weight of the photosensitive polyimide precursor.

By stirring and dissolving the above-mentioned suitable tetracarboxylic dianhydride and the above-mentioned alcohols in a solvent, which is described later, at a temperature of 20 to 50° C. for 4 to 10 hours in the presence of a basic catalyst such as pyridine, and mixing, the esterification reaction of the acid anhydride proceeds, whereby the desired acid/ester body is obtained.

(Preparation of Polyimide Precursor)

To the above acid/ester body (typically a solution in a solvent, which is described later), a suitable dehydration condensing agent such as dicyclohexylcarbodiimide, 1-ethoxycarbonyl-2-ethoxy-1,2-dihydroquinoline, 1,1-carbonyldioxy-1,2,3-benzotriazole, or N,N'-disuccinimidyl carbonate is charged into to convert the acid/ester body to a polyacid anhydride, and to this, a diamine containing a divalent organic group $Y_1$ suitably used in the present embodiment separately dissolved or dispersed in a solvent is added dropwise to carry out amide polycondensation, whereby the desired polyimide precursor can be obtained. Alternatively, the desired polyimide precursor can be obtained by reacting the above acid/ester body with a diamine compound in the presence of a base such as pyridine after acid chloridization of an acid moiety using thionyl chloride.

Examples of the diamine containing the divalent organic group $Y_1$ suitably used in the present embodiment include, but are not limited to, diamines having the structure represented by general formula (21) above, for example, p-phenylenediamine, m-phenylenediamine, 4,4-diaminodiphenyl ether(4,4'-oxydianiline (ODA)), 3,4'-diaminodiphenyl ether, 3,3'-diaminodiphenyl ether, 4,4'-diaminodiphenylsulfide, 3,4'-diaminodiphenylsulfide, 3,3'-diaminodiphenylsulfide, 4,4'-diaminodiphenylsulfone, 3,4'-diaminodiphenylsulfone, 3,3'-diaminodiphenylsulfone, 4,4'-diaminophenyl, 3,4'-diaminophenyl, 3,3'-diaminophenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)phenyl, 4,4-bis(3-aminophenoxy)phenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-tridine sulfone, and 9,9-bis(4-aminophenyl)fluorene, and derivatives thereof obtained by substituting a part of the hydrogen atoms on the benzene ring thereof with a methyl group, ethyl group, hydroxymethyl group, hydroxyethyl group, or halogen, such as, for example, 3,3'-dimethyl-4,4'-diaminobiphenyl, 2,2'-dimethyl-4,4'-diaminobiphenyl(2,2'-dimethylbiphenyl-4,4'-diamine (m-TB)), 3,3'-dimethyl-4,4'-diaminodiphenylmethane, 2,2'-dimethyl-4,4'-diaminobiphenylmethane, 3,3'-dimethoxy-4,4'-diamionbipheny, and 3,3'-dichloro-4,4'-diaminobiphenyl, and mixtures thereof.

After completion of the amide polycondensation reaction, the water absorption by-products of the dehydration condensing agent present in the reaction solution are filtered as necessary, and then a poor solvent such as water, an aliphatic lower alcohol, or a mixed liquid thereof is charged into the obtained polymer component, the polymer component is precipitated, and a redissolution or reprecipitation process is repeated, whereby the polymer is purified, and vacuum drying is performed to isolate the target polyimide precursor. In order to improve the degree of purification, a solution of the polymer may be passed through a column filled with an anion and/or cation exchange resin swollen with a suitable organic solvent to remove ionic impurities.

The molecular weight of the above (A) polyimide precursor is preferably 8,000 to 150,000, more preferably 9,000 to 50,000, when measured by polystyrene-equivalent weight average molecular weight by gel permeation chromatography. When the weight average molecular weight is 8,000 or more, the mechanical physical properties are good, and when the weight average molecular weight is 150,000 or less, dispersibility in a developer is good, and the resolution of a relief pattern thereof is good. Tetrahydrofuran and N-methyl-2-pyrrolidone are recommended as developing solvents for gel permeation chromatography. The weight average molecular weight is also determined from a calibration curve prepared using standard monodisperse polystyrene. As the standard monodisperse polystyrene, it is recommended to select from the organic solvent-based standard sample STANDARD SM-105 produced by Showa Denko Co., Ltd.

(B) Compound Having Urethane Bond or Urea Bond

The (B) compound used in the present embodiment contains at least one selected from a urethane bond and a urea bond in the molecular structure thereof (hereinafter, also referred to as a "urethane/urea compound" in the present embodiment). The compound used in the present embodiment is not limited in other structures as long as it has a urethane bond and/or a urea bond in molecular structure thereof. Among these, it is preferable to have a urea bond from the viewpoint of suppressing Cu surface voids and chemical resistance. In the present embodiment, it is preferable that the (B) compound further has a (meth)acrylic group, a hydroxyl group, and at least one functional group selected from the group consisting of an alkoxy group and an amino group.

Though the reason why the chemical resistance and the resolution are suitable when including the compound (B) according to the present embodiment is not clear, the present inventors consider as follows. Specifically, in one aspect, since the negative photosensitive resin composition is heated and cured at a temperature as low as 180° C., conversion of the polyimide precursor into polyimide tends not to be sufficient. Conversely, in the negative photosensitive resin composition of the present embodiment, it is considered that, by including the compound (B) having a urethane/urea, a part of the compound (B) is thermally decomposed, whereby an amine or the like is generated, and the amine or the like promotes conversion of the polyimide precursor into polyimide. In a preferred embodiment, when the compound (B) further has a (meth)acrylic group, particularly when it is a negative photosensitive resin composition, it is considered that the compound (B) reacts with the side chain portion of the polyimide precursor by light irradiation and crosslinks, whereby it is more likely to be present in the vicinity of the polyimide precursor and conversion efficiency can be drastically increased.

In the present embodiment, when the compound (B) further has a (meth)acrylic group, the (meth)acrylic equivalent weight of the compound (B) is preferably 150 to 400 g/mol. When the (meth)acrylic equivalent of the (B) compound is 150 g/mol or more, the chemical resistance of the negative photosensitive resin composition tends to be suitable, and when it is 400 g/mol or less, the developability tends to be suitable. The lower limit value of the (meth)acrylic equivalent of the (B) compound is more preferably 200 g/mol or more, 210 g/mol or more, 220 g/mol or more, or 230 g/mol or more, and further preferably 240 g/mol or more or 250 g/mol or more, and the lower limit value is more preferably 350 g/mol or less, 330 g/mol or less, and still more preferably 300 g/mol or less. The (meth)acrylic equivalent of the (B) compound is more preferably from 210 to 400 g/mol, particularly preferably from 220 to 400 g/mol.

The compound (B) having a urethane/urea bond used in the present embodiment is preferably a (meth)acrylic group-containing urethane/urea compound having a structure represented by the following general formula (3):

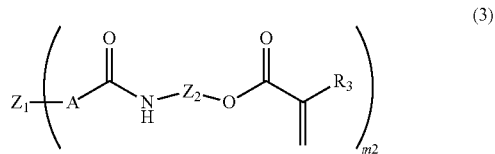

(3)

where $R_3$ is a hydrogen atom or a methyl group, A is one group selected from the group consisting of —O—, —NH—, and —$NL_4$-, $L_4$ is a $C_{1-12}$ monovalent organic group, $Z_1$ is an $C_{2-24}$ organic group having a valency of $m_2$, $Z_2$ is a $C_{2-8}$ divalent organic group, and $m_2$ is an integer of 1 to 3.

$R_3$ is not limited as long as it is a hydrogen atom or a methyl group, but a methyl group is preferred from the viewpoint of developability. $Z_1$ is not limited as long as it a $C_{2-20}$ organic group having a valency of $m_2$. $Z_1$ can also include heteroatoms such as oxygen atoms, sulfur atoms, nitrogen atoms, and phosphorus atoms. When the number of carbon atoms of $Z_1$ is 2 or more, the chemical resistance of the negative photosensitive resin composition tends to be suitable, and when the number of carbon atoms is 20 or less, the developability tends to be suitable. $Z_1$ preferably has 3 or more carbon atoms, more preferably 4 or more, and has preferably 18 or less, more preferably 16 or less. $Z_2$ is not limited as long as it is a $C_{2-8}$ divalent organic group. $Z_2$ can also include heteroatoms such as oxygen atoms, sulfur atoms, nitrogen atoms, and phosphorus atoms. When the number of carbon atoms of $Z_2$ is 2 or more, the chemical resistance of the negative photosensitive resin composition tends to be suitable, and when the number of carbon atoms is 8 or less, the heat resistance tends to be suitable. $Z_2$ preferably has 6 or less carbon atoms, more preferably 4 or less. A is one group selected from the group consisting of —O—, —NH—, and —$NL_4$-. From the viewpoint of chemical resistance, A is preferably —NH— or —$NL_4$-.

Though the method for producing the (meth)acrylic group-containing urea/urethane compound of the general formula (3) above is not particularly limited, it can be obtained, for example, by reacting an isocyanate compound represented by the following general formula with an amine and/or a hydroxyl group-containing compound.

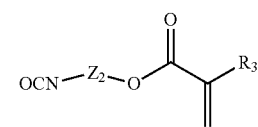

Among the (B) compounds described above, at least one compound selected from the group consisting of the following formulas (4) to (7), and (11) to (14) is particularly preferable from the viewpoint of chemical resistance, void suppression, and developability. Note that the compounds represented by the following formulas (4) to (7) and (11) to (14) are also embodiments of the present invention.

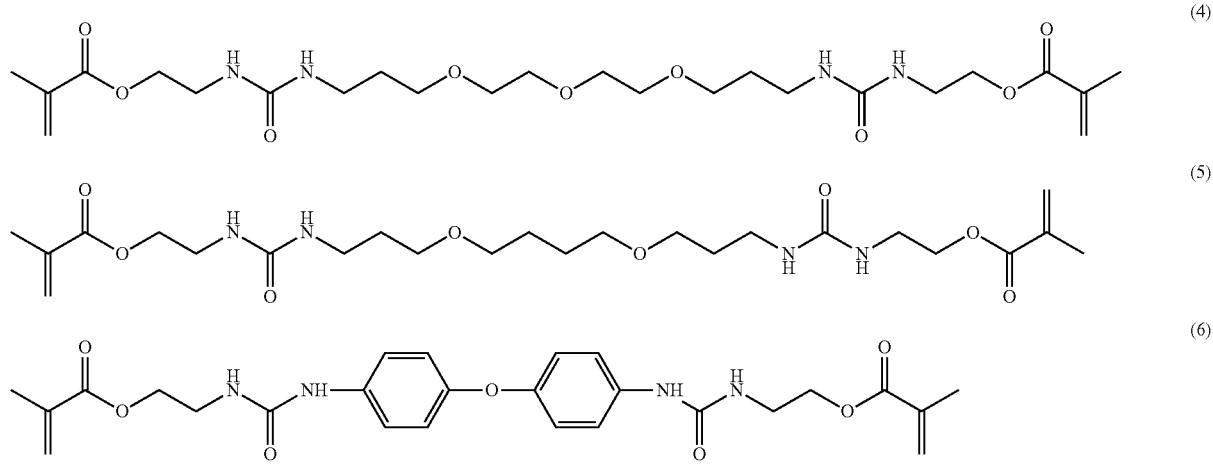

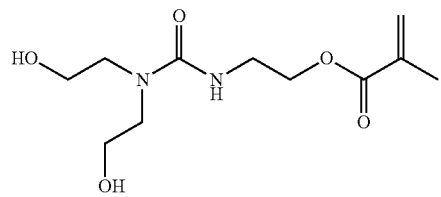
(7)

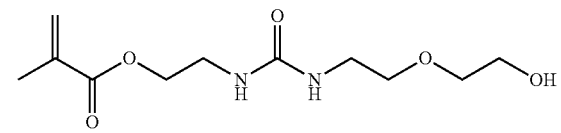
(11)

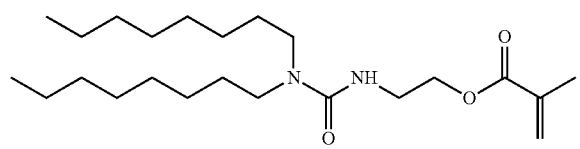
(12)

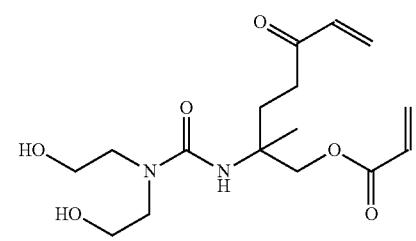
(13)

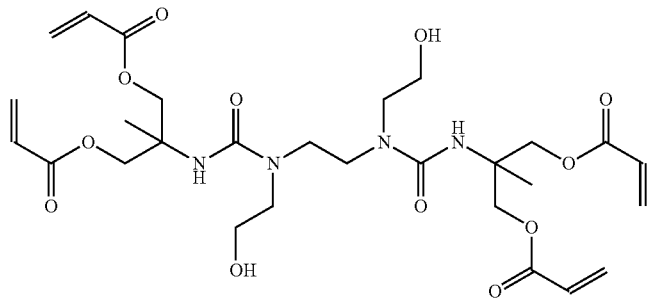
(14)

It is preferable that the urethane/urea compound (B) of the present embodiment further has at least one functional group selected from the group consisting of a hydroxyl group, an alkoxy group, and an amino group. By including at least one selected from the group consisting of a hydroxyl group, an alkoxy group, and an amino group, the urethane/urea compound of the present embodiment tends to have good adhesion to a mold resin used in fan-out semiconductor packages, which is one embodiment of the present invention. Though the reason for this is not clear, the present inventors consider as follows. Specifically, in one aspect, the negative photosensitive resin composition is heated and cured at a temperature as low as 180° C. or less. At such a low temperature, the epoxy resin contained in the mold resin used in fan-out semiconductor packages has an epoxy structure without opening a part of the ring, and the epoxy structure tends to interact with hydroxyl groups, alkoxy groups, or amino groups contained in the (B) urethane/urea compound. Conversely, it is presumed that the urethane/urea structure contained in the (B) compound interacts with the polyimide resin, thereby exhibiting high adhesion to the mold resin. Among these functional groups, a hydroxyl group and an alkoxy group are preferred, and a hydroxyl group is particularly preferred. From the viewpoint of adhesion to the mold resin, chemical resistance, and Cu void suppression, it is more preferable that the (B) compound have a (meth)acrylic group and a hydroxyl group in the molecular structure thereof, in addition to the urethane/urea structure.

The alkoxy group is more preferably a $C_{1-10}$ alkoxy group such as a methoxy group, an ethoxy group, or a propoxy group. Examples of these compounds include those having the structures below.

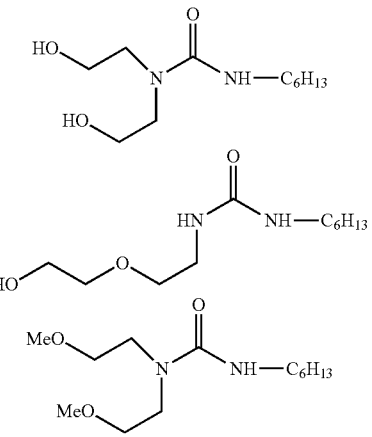

One type of the (B) compound in the present embodiment may be used alone, or two or more types thereof may be mixed and used. The amount of the (B) compound to be mixed is preferably 0.1 parts by weight to 30 parts by weight, and more preferably 1 part by weight to 20 parts by weight with respect to 100 parts by weight of the (A) polyimide precursor. The mixing amount of (B) above is preferably 0.1 parts by weight or more from the viewpoint of photosensitivity or patternability, and is preferably 30 parts by weight or less from the viewpoint of physical properties of the photosensitive resin layer after curing of the negative photosensitive resin composition.

(C) Photopolymerization Initiator

As the photopolymerization initiator, a photoradical polymerization initiator is preferred. Examples of photoradical polymerization initiator include, but are not limited to, benzophenone derivatives such as benzophenone, methyl o-benzoylbenzoic acid, 4-benzoyl-4'-methyldiphenyl ketone, dibenzyl ketone, and fluorenone; acetophenone derivatives such as 2,2'-diethoxyacetophenone, 2-hydroxy-2-methylpropiophenone, and 1-hydroxycyclohexylphenyl ketone; thioxantone derivatives such as thioxanthone, 2-methylthioxanthone, 2-isopropylthioxanthone, and diethyl thioxanthone; benzyl derivatives such as benzyl, benzyl dimethyl ketal, and benzyl-β-methoxyethyl acetal; benzoin derivatives such as benzoin and benzoin methyl ether; oximes such as 1-phenyl-1,2-butandion-2-(o-methoxycarbonyl) oxime, 1-phenyl-1,2-propanedione-2-(o-methoxycarbonyl) oxime, 1-phenyl-1,2-propanedione-2-(o-ethoxycarbonyl) oxime, 1-phenyl-1,2-propanedione-2-(o-benzoyl) oxime, 1,3-diphenylpropanthrion-2-(o-ethoxycarbonyl) oxime, and 1-phenyl-3-ethoxypropanetrione-2-(o-benzoyl) oxime; N-arylglycines such as N-phenylglycine; peroxides such as benzoyl perchloride, aromatic biimidazoles; titanocenes; and photoacid generators such as α-(n-octanesulfonyloxyimino)-4-methoxybenzyl cyanide. Among these photopolyimerization initiators, oximes are more preferably from the viewpoint of in particular of light sensitivity.

The amount of the (C) photopolymerization initiator to be mixed is preferably 0.1 parts by weight to 20 parts by weight, and more preferably 1 part by weight to 8 parts by weight with respect to 100 parts by weight of the (A) polyimide precursor. The above mixing amount is preferably 0.1 parts by weight or more from the viewpoint of photosensitivity or patternability, and is preferably 20 parts by weight or less from the viewpoint of physical properties of the photosensitive resin layer after curing of the negative photosensitive resin composition.

(D) Corrosion Inhibitor

The negative photosensitive resin composition of the present embodiment may further include a corrosion inhibitor. The corrosion inhibitor is not limited as long as corrosion of the metal can be prevented thereby, and examples thereof include nitrogen-containing heterocyclic compounds. Examples of nitrogen-containing heterocyclic compounds include azole compounds and purine derivatives.

Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl) triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl) benzotriazole, 2-[2-hydroxy-3,5-bis(α,α-dimethylbenzyl)phenyl]-benzotriazole, 2-(3,5-di-t-butyl-2-hydroxyphenyl)benzotriazole, 2-(3-t-butyl-5-methyl-2-hydroxyphenyl)-benzotriazole, 2-(3,5-di-t-amyl-2-hydroxyphenyl)benzotriazole, 2-(2'-hydroxy-5'-t-octylphenyl)benzotriazole, hydroxyphenyl benzotriazole, triltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole, and 1-methyl-1H-tetrazole.

Particularly preferable examples of azole compounds include triltriazole, 5-methyl-1H-benzotriazole, and 4-methyl-1H-benzotriazole. Furthermore, one azole compound may be used alone or two or more thereof may be mixed and used.

Examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl) adenine, guanine oxime, N-(2-hydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenin, 5-azaadenine, 8-azaadenine, 8-azaguanin, 8-azapurine, 8-azaxanthine, and 8-azahypoxanthine, and derivatives thereof.

When the negative photosensitive resin composition contains an azole compound or a purine derivative, the mixing amount thereof is preferably, from the viewpoint of photosensitive characteristics, 0.05 to 5 parts by weight, and more preferably 0.1 to 5 parts by weight relative to 100 parts by weight of the (A) polyimide precursor. If the mixing amount of the azole compound relative to 100 parts by weight of the (A) polyimide precursor is 0.05 parts by weight or more, when the negative photosensitive resin composition of the present embodiment is formed on copper or a copper alloy, discoloration of the copper or copper alloy surface is suppressed, and conversely, when the azole compound is 5 parts by weight or less, photosensitivity is excellent.

When the negative photosensitive resin composition of the present embodiment contains a (D) corrosion inhibitor, in particular, void formation in the Cu layer is suppressed. Though the reason for this effect is not clear, it is considered that the corrosion inhibitor present on the Cu surface and the (meth)acrylic group, the hydroxyl group, the alkoxy group, or the amino group contained in the preferred embodiment of the urethane/urea compound interact with each other to form a dense layer in the vicinity of the Cu interface.

(E) Silane Coupling Agent

The negative photosensitive resin composition of the present embodiment may further include a silane coupling agent. Examples of silane coupling agents include γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyl dimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl) succinimide, N-[3-(triethoxysilyl)propyl]phthalamic acid, benzophenone-3,3'-bis (N-[3-triethoxysilyl]propylamide)-4,4'-dicarboxylic acid, benzene-1,4-bis(N-[3-triethoxysilyl]propylamide)-2,5-dicarboxylic acid, 3-(triethoxysilyl)propylsuccinic hydride, N-phenylaminopropyltrimethoxysilane, 3-ureidopropyltrimethoxysilane, 3-ureidopropyltriethoxysilane, and 3-(trialkoxysilyl) propylsuccinic anhydride.

More specific examples of silane coupling agents include 3-mercaptopropyltrimethoxysilane (produced by Shin-Etsu Chemical Industries, Ltd., product name: KBM803; and produced by Chisso Co. Ltd.; product name: Sila Ace S810), 3-mercaptopropyltriethoxysilane (produced by ASMAX Co., Ltd.: product name SIM6475.0), 3-mercaptopropylmethyldimethoxysilane (produced by Shin-Etsu Chemical Co., Ltd.: product name LS1375, produced by Asmax Co., Ltd.: product name SIM6474.0), mercaptomethyltrimethoxysilane (produced by Azmax Co., Ltd.: product name SIM6473.5C), mercaptomethylmethyldimethoxysilane (produced by Azmax Co., Ltd.: product name SIM6473.0), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, N-(3-triethoxysilylpropyl) urea (produced by Shin-Etsu Chemical Co., Ltd.: product name LS3610; produced by Asmax Co., Ltd.: product name SIU9055.0), N-(3-trimethoxysilylpropyl) urea (produced by Asmax Co., Ltd.: product name SIU9058.0), N-(3-diethoxymethoxysilylpropyl) urea, N-(3-ethoxydimethoxysilylpropyl) urea, N-(3-tripropoxysilylpropyl) urea, N-(3-diethoxypropoxysilylpropyl) urea, N-(3-ethoxydipropoxysilylpropyl) urea, N-(3-dimethoxypropoxysilylpropyl) urea, N-(3-methoxydipropoxysilylpropyl) urea, N-(3-trimethoxysilylethyl) urea, N-(3-ethoxydimethoxysilylethyl) urea, N-(3-tripropoxysilylethyl) urea, N-(3-tripropoxysilylethyl) urea, N-(3-ethoxydipropoxysilylethyl) urea, N-(3-dimethoxypropoxysilylethyl) urea, N-(3-methoxydipropoxysilylethyl) urea, N-(3-trimethoxysilylbutyl) urea, N-(3-triethoxysilylbutyl) urea, N-(3-tripropoxysilylbutyl) urea, 3-(m-aminophenoxy)propyltrimethoxysilane (produced by Asmax Co., Ltd.: product name SLA0598.0), m-aminophenyltrimethoxysilane (produced by Asmax Co., Ltd.: product name: SLA0599.0), p-aminophenyltrimethoxysilane (produced by Azmax Co., Ltd.: product name SLA0599.1) aminophenyltrimethoxysilane (produced by Azmax Co., Ltd.: product name SLA0599.2), 2-(trimethoxysilylethyl)pyridine (produced by Asmax Co., Ltd.: product name: SIT8396.0), 2-(triethoxysilylethyl) pyridine, 2-(dimethoxysilylmethylethyl) pyridine, 2-(diethoxysilylmethylethyl)pyridine, (3-triethoxysilylpropyl)-t-butylcarbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis(methoxyethoxyethoxysilane), bis(trimethoxysilyl)ethane, bis(trimethoxysilyl)hexane, bis (triethoxysilyl)methane, bis (triethoxysilyl)ethane, bis(triethoxysilyl)ethylene, bis(triethoxysilyl)octane, bis(triethoxysilyl)octadiene, bis[3-(triethoxysilyl)propyl]disulfide, bis[3-(triethoxysilyl)propyl] tetrasulfide, di-t-butoxydiacetoxysilane, di-i-butoxyaluminoxytriethoxysilane, phenylsilanetriol, methylphenylsilanediol, ethylphenylsilanediol, n-propylphenylsilanediol, isopropylphenylsilanediol, n-butylsiphenylsilanediol, isobutylphenylsilanediol, tert-butylphenylsilanediol, diphenylsilanediol, dimethoxydiphenylsilane, diethoxydiphenylsilane, dimethoxydi-p-tolylsilane, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethylphenylsilanol, isobutylethylphenylsilanol, tert-butylethylphenylsilanol, methyldiphenyl silanol, ethyldiphenylsilanol, n-propyldiphenylsilanol, isopropyldiphenylsilanol, n-butyldiphenylsilanol, isobutyldiphenylsilanol, tert-butyldiphenylsilanol, and triphenylsilanol, though the silane coupling agent is not limited thereto. These may be used alone or in combination of two or more.

Among the above silane coupling agents, from the viewpoint of storage stability, the silane coupling agent is preferably phenylsilane triol, trimethoxyphenylsilane, trimethoxy(p-tolyl)silane, diphenylsilane diol, dimethoxydiphenylsilane, diethoxydiphenylsilane, dimethoxydi-p-tolylsilane, triphenylsilanol, or a silane coupling agent having a structure represented by the following formula.

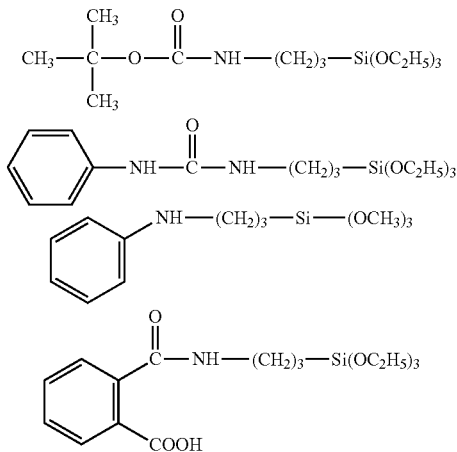

When a silane coupling agent is used, the mixing amount thereof is preferably 0.1 to 20 parts by weight with respect to 100 parts by weight of the (A) polyimide precursor. When the negative photosensitive resin composition of the present embodiment contains the (E) silane coupling agent, in particular, void formation of the Cu layer is suppressed. Though the reason for this effect is not clear, it is considered that the silane coupling agent unevenly distributed on the Cu surface and the (meth) acrylic group, the hydroxyl group, the alkoxy group, or the amino group contained in the preferred embodiment of the urethane/urea compound interact with each other to form a dense layer in the vicinity of the Cu interface.

(F) Other Components

The negative photosensitive resin composition of the present embodiment may further contain components other than components (A) to (E) described above. Examples of components other than components (A) to (E) include, but are not limited to, a solvent, a hindered phenol compound, an organic titanium compound, a sensitizer, a photopolymerizable unsaturated monomer, and a thermal polymerization inhibitor.

Solvent

As a solvent, amides, sulfoxides, ureas, ketones, esters, lactones, ethers, halogenated hydrocarbons, hydrocarbons, and alcohols. More specifically, for example, N-methyl-2-pyrrolidone, N-ethyl-2-pyrrolidone, N,N-dimethylacetamide, N,N-dimethylformamide, dimethyl sulfoxide, tetramethylurea, acetone, methyl ethyl ketone, methyl isobutyl ketone, cyclopentanone, cyclohexanone, methyl acetate, ethyl acetate, butyl acetate, diethyl oxalate, methyl lactate, ethyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene, and mesitylene can be used. Among these, N-methyl-2-pyrrolidone, dimethyl sulfoxide, tetramethyl urea, butyl acetate, ethyl lactate, γ-butyrolactone, propylene glycol monomethyl ether acetate, propylene glycol monomethyl ether, diethylene glycol dimethyl ether, benzyl alcohol, phenyl glycol, and tetrahydrofurfuryl alcohol are preferable from the viewpoints of solubility of the resin, stability of the resin composition, and adhesion to the substrate.

Among such solvents, among others, solvents which completely dissolve the produced polymer are preferred, and examples thereof include N-methyl-2-pyrrolidone, N-ethyl-2-pyrrolidone, N,N-dimethylacetamide, N,N-dimethylformamide, dimethyl sulfoxide, tetramethyl urea, and gamma butyrolactone.

In the negative photosensitive resin composition of the present embodiment, the amount of the solvent to be used is preferably from 100 to 1000 parts by weight, more preferably from 120 to 700 parts by weight, and further preferably from 125 to 500 parts by weight, with respect to 100 parts by weight of the (A) polyimide precursor.

Hindered Phenolic Compounds

In order to suppress discoloration on the copper surface, the negative photosensitive resin composition may optionally include a hindered phenol compound. Examples of hindered phenolic compounds include 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylenebis (2,6-di-t-butylphenol), 4,4'-thio-bis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxyphenyl) propionate], N,N'-hexamethylenebis(3,5-di-t-butyl-4-hydroxy-hydrocinnamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl) propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H, 5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The amount of the hindered phenol compound to be mixed is preferably, from the viewpoint of photosensitivity characteristics, 0.1 to 20 parts by weight, and more preferably 0.5 to 10 parts by weight with respect to 100 parts by weight of the (A) polyimide precursor. If the mixing amount of the hindered phenol compound, with respect to 100 parts by weight of the (A) polyimide precursor, is 0.1 parts by weight or more, when, for example, the photosensitive resin composition of the present invention is formed on copper or a copper alloy, discoloration and corrosion of the copper or copper alloy is prevented, and conversely, when the amount is 20 parts by weight or less, photosensitivity is excellent.

Organic Titanium Compound

The negative photosensitive resin composition of the present embodiment may contain an organic titanium compound. By including an organic titanium compound, a photosensitive resin layer excellent in chemical resistance can be formed even when cured at a low temperature.

Examples of organic titanium compounds which can be used include those in which an organic chemical is bonded to a titanium atom via a covalent bond or an ionic bond. Specific examples of organic titanium compounds are shown in I) to VII) below:

I) Titanium chelate compounds: among these, titanium chelates having two or more alkoxy groups are more preferred in order to obtain good storage stability and patterning of the negative photosensitive resin composition. Specific examples thereof include titanium bis (triethanolamine) diisopropoxide, titanium di(n-butoxide)bis(2,4-pentanedionate), titanium diisopropoxide bis(2,4-pentanedionate), titanium diisopropoxide bis (tetramethylheptanedionate), and titanium diisopropoxide bis(ethylacetate).

II) Tetraalkoxy titanium compounds: for example, titanium tetra (n-butoxide), titanium tetraethoxide, titanium tetra(2-ethylhexaido), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide, and titanium tetrakis[bis{2,2-(allyloxymethyl)butoxide}].

III) Titanocene compounds: for example, pentamethylcyclopentadienyl titanium trimethoxide, bis(η5-2,4-cyclopentadien-1-yl)bis(2,6-difluorophenyl)titanium, and bis(η5-2,4-cyclopentadien-1-yl)bis(2,6-difluoro-3-(1H-pyrrol-1-yl)phenyl)titanium.

IV) Monoalkoxytitanium compounds: for example, titanium tris(dioctylphosphate) isopropoxide and titanium tris(dodecylbenzenesulfonate) isopropoxide.

V) Titanium oxide compounds: for example, titanium oxide bis(pentanedionate), titanium oxide bis(tetramethylheptanedionate), and phthalocyanine titanium oxide.

VI) Titanium tetraacetylacetonate compounds: for example, titanium tetraacetylacetonate.

VII) Titanate coupling agents: for example, isopropyltridodecylbenzenesulfonyl titanate.

Among these, it is preferable that the organic titanium compound be at least one compound selected from the group consisting of I) titanium chelate compounds, II) tetraalkoxy titanium compounds, and III) titanocene compounds described above, from the viewpoint of exhibiting better chemical resistance. In particular, titanium diisopropoxide bis(ethylacetoacetate), titanium tetra (n-butoxide), and bis (η5-2,4-cyclopentadien-1-yl)bis(2,6-difluoro-3-(1H-pyrrol-1-yl)phenyl)titanium are preferable.

When an organic titanium compound is mixed, the mixing amount thereof is preferably 0.05 to 10 parts by weight and more preferably 0.1 to 2 parts by weight with respect to 100 parts by weight of the (A) polyimide precursor. When the mixing amount of the organic titanium compound is 0.05 parts by weight or more, good heat resistance and chemical resistance are exhibited, and conversely, when the mixing amount is 10 parts by weight or less, storage stability is excellent.

Sensitizer

The negative photosensitive resin composition of the present embodiment may optionally include a sensitizer in order to improve the photosensitivity thereof. Examples of sensitizers include Michler's ketone, 4,4'-bis(diethylamino) benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamilidene indanone, p-dimethylaminobenzylideneindanone, 2-(p-dimethylaminophenylbiphenylene)-benzothiazol, 2-(p-dimethylaminophenylvinylene) benzothiazol, 2-(p-dimethylaminophenylvinylene) isonaphthiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, dimethylaminobenzoic acid isoamyl, diethylaminobenzoic acid isoamyl, 2-mercaptobenzimidazole, 1-phenyl-5-mercaptotetrazole, 2-mercaptobenzothiazol, 2-(p-dimethylaminostyryl)benzoxazole, 2-(p-dimethylaminostyryl)benzthiazole, 2-(p-dimethylaminostyryl)naphtho(1,2-d)thiazole, and 2-(p-dimethylaminobenzoyl)styrene. These may be used alone or a combination of a plurality thereof, for example, two to five types in combination.

When the photosensitive resin composition contains a sensitizer, the mixing amount thereof is preferably 0.1 to 25 parts by weight with respect to 100 parts by weight of the (A) polyimide precursor.

Photopolymerizable Unsaturated Monomer

The negative photosensitive resin composition may optionally include a monomer (a photopolymerizable unsaturated monomer) having a photopolymerizable unsaturated bond in order to improve resolution of the relief pattern. As such a monomer, (meth)acrylic compounds which undergo a radical polymerization reaction with a photopolymerization initiator are preferred, and though not limited thereto, examples thereof include mono- or diacrylates and methacrylates of ethylene glycol or polyethylene glycol, such as diethylene glycol dimethacrylate, tetraethylene glycol dimethacrylate, mono- or diacrylates and methacrylates of propylene glycol or polypropylene glycol, mono-, di- or triacrylates and methacrylates of glycerol, cyclohexanediacrylate and dimethacrylate, diacrylate and dimethacrylate of 1,4-butanediol, diacrylate and dimethacrylate of 1,6-hexanediol, diacrylate and dimethacrylate ofneopentyl glycol, mono- or diacrylates and methacrylates of bisphenol A, benzenetrimethacrylate, isobornyl acrylate and methacrylate, acrylamide and derivatives thereof, methacrylamide and derivatives thereof, trimethylolpropane triacrylate and methacrylate, di- or triacrylates and methacrylates of glycerol, di-, tri-, or tetraacrylates and methacrylates of pentaerythritol, and ethylene oxide or propylene oxide adducts of these compounds.

When the photosensitive resin composition contains a photopolymerizable unsaturated monomer, the mixing amount thereof is preferably 1 to 50 parts by weight with respect to 100 parts by weight of the (A) polyimide precursor.

Thermal Polymerization Inhibitor

The negative photosensitive resin composition of the present embodiment may optionally include a thermal polymerization inhibitor in order to improve the stability of the viscosity and photosensitivity of the negative photosensitive resin composition during storage, particularly in a solution containing a solvent. Examples of thermal polymerization inhibitors include hydroquinone, N-nitrosodiphenylamine, p-tert-butyl catechol, phenothiazine, N-phenylnaphthylamine, ethylenediaminetetraacetic acid, 1,2-cyclohexanediaminetetraacetic acid, glycol etherdiaminetetraacetic acid, 2,6-di-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salts, and N-nitroso-N(1-naphthyl)hydroxylamine ammonium salts.

<Method for Production of Cured Relief Pattern and Semiconductor Device>

The method for the production of the cured relief pattern of the present embodiment comprises the steps of:

(1) applying the negative photosensitive resin composition of the present embodiment described above onto a substrate to form a photosensitive resin layer on the substrate, (2) exposing the photosensitive resin layer, (3) developing the exposed photosensitive resin layer to form a relief pattern, and (4) heat-treating the relief pattern to form a cured relief pattern.

(1) Photosensitive Resin Layer Formation Step

In this step, the negative photosensitive resin composition of the present embodiment is applied onto a substrate, and if necessary, thereafter dried to form a photosensitive resin layer. As the application method, methods conventionally used for the application of a photosensitive resin composition, for example, a method of application with a spin coater, a bar coater, a blade coater, a curtain coater, or a screen-printing machine, or a method of spray coating with a spray coater can be used.

If necessary, the coating film containing the photosensitive resin composition can be dried. As the drying method, a method such as air drying, heating drying with an oven or a hot plate, or vacuum drying can be used. Specifically, when air drying or heating drying is performed, drying can be performed for 1 minute to 1 hour at 20° C. to 140° C. In this manner, the photosensitive resin layer can be formed on the substrate.

(2) Exposure Step

In this step, the photosensitive resin layer formed as described above is exposed with an ultraviolet light source. As the exposure method, an exposure device such as a contact aligner, a mirror projection, or a stepper can be used. Exposure can be performed through a photomask or reticle having a pattern or directly.

Thereafter, for the purpose of improving photosensitivity, post-exposure baking (PEB) and/or pre-development baking according to a combination of an arbitrary temperature and time may be performed, if necessary. The range of baking conditions is preferably from 40° C. to 120° C., and the time is preferably from 10 seconds to 240 seconds, though the baking is not limited to these ranges unless the various properties of the photosensitive resin composition of the present invention are inhibited thereby.

(3) Relief Pattern Formation Step

In this step, the unexposed portions of the exposed photosensitive resin layer are developed and removed from the substrate, thereby leaving a relief pattern on the substrate. As a developing method for developing a photosensitive resin layer after exposure (irradiation), any method can be selected and used from conventionally known methods of developing a photoresist, for example, a rotary spray method, a paddle method, and an immersion method accompanied by an ultrasonic treatment. Furthermore, after development, for the purpose of adjusting the shape of the relief pattern, post-development baking may be performed by a combination of an arbitrary temperature and time, if necessary.

As the developer used for development, for example, a good solvent for negative photosensitive resin compositions or a combination of a good solvent and a poor solvent is preferred. As the good solvent, for example, N-methyl-2-pyrrolidone, N-cyclohexyl-2-pyrrolidone, N,N-dimethylacetamide, cyclopentanone, cyclohexanone, γ-butyrolactone, and α-acetyl-γ-butyrolactone are preferred. As the poor solvent, for example, toluene, xylene, methanol, ethanol, isopropyl alcohol, ethyl lactate, propylene glycol methyl ether acetate, and water are preferred. When a good solvent and a poor solvent are mixed and used, it is preferable to adjust the ratio of the poor solvent to the good solvent in accordance with the solubility of the polymer in the negative photosensitive resin composition. In addition, two or more solvents may be used, for example, in combination of a plurality of types thereof.

(4) Cured Relief Pattern Formation Step

In this step, the relief pattern obtained by the above development is heated to dilute the photosensitive component, and the (A) polyimide precursor is imidized, thereby converting it into a cured relief pattern composed of polyimide. As a method of heating and curing, for example, various methods such as those using a hot plate, an oven, and a temperature raising oven capable of setting a temperature program can be selected. Heating may be carried out, for example, at 170° C. to 400° C. for 30 minutes to 5 hours. Air may be used as an atmosphere gas at the time of heating and curing, and an inert gas such as nitrogen or argon may be used.

<Polyimide>

The structure of the polyimide contained in the cured relief pattern formed from the above polyimide precursor composition is represented by the following general formula (10).

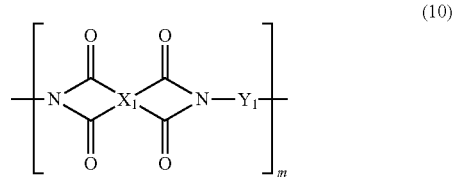

$$(10)$$

where $X_1$ and $Y_1$ are the same as $X_1$ and $Y_1$ in formula (1), and m is a positive integer.

Preferred $X_1$ and $Y_1$ in general formula (1) are also preferred in the polyimide of the general formula (10) for the same reasons. The number of repeating units m of general formula (10) is not particularly limited, but may be an integer of 2 to 150. Furthermore, the method for producing a polyimide comprising the step of converting the negative photosensitive resin composition into polyimide described above is also an aspect of the present invention.

<Semiconductor Device>

In the present embodiment, there is also provided a semiconductor device having a cured relief pattern obtained by the above-described method of producing a cured relief pattern. Thus, a semiconductor device having a base material which is a semiconductor element and a cured relief pattern of polyimide formed on the base material by the above-described curing relief pattern producing method can be provided. Furthermore, the present invention is also applicable to a method of producing a semiconductor device in which a semiconductor element is used as a base material and the above-described method of producing a cured relief pattern is included as a part of a step. The semiconductor device of the present invention can be produced by forming a cured relief pattern formed by the above-described cured relief pattern production method as a surface protective film, an interlayer insulating film, a rewiring insulating film, a protective film for flip-chip devices, or a protective film of a semiconductor device having a relief structure, and combining it with a known method of producing a semiconductor device.

<Display Device>

In the present embodiment, there is provided a display device comprising a display element and a cured film provided on an upper portion of the display element, wherein the cured film is the cured reliefpattern described above. The cured relief pattern may be laminated in direct contact with the display element or may be laminated with another layer interposed therebetween. Examples of cured films include surface protective films, insulating films, and flattening films for TFT liquid crystal display elements and color filter elements, protrusions for MVA type liquid crystal display devices, and partition walls for organic EL element cathodes.

In addition to application to a semiconductor device as described above, the negative photosensitive resin composition of the present invention is also useful in applications such as interlayer insulation of multilayer circuits, covercoating of flexible copper clad plates, solder resist films, and liquid crystal alignment films.

EXAMPLES

The present embodiment will be specifically described by way of the Examples below, but the present embodiment is not limited thereto. In Examples, Comparative Examples, and Production Examples, the physical properties of the polymer or the negative photosensitive resin composition were measured and evaluated in accordance with the following methods.

<Measurement and Evaluation Methods>

(1) Weight-Average Molecular Weight

The weight average molecular weight (Mw) of each resin was measured using the gel permeation chromatography method (standard polystyrene conversion) under the following conditions.

Pump: JASCO PU-980
Detector: JASCO RI-930
Column Oven: JASCO CO-965, 40° C.
Columns: two serially connected Shodex KD-806M produced by Showa Denko Co., Ltd., or serially connected Shodex 805M/806M produced by Showa Denko Co., Ltd.
Standard Monodisperse Polystyrene: Shodex STANDARD SM-105 produced by Showa Denko Co., Ltd.

Mobile Phase: 0.1 mol/L LiBr/N-methyl-2-pyrrolidone (NMP)

Flow rate: 1 mL/min (2) Production of Cured Relief Pattern on Cu

Ti having a thickness of 200 nm and Cu having a thickness of 400 nm were sputtered in this order onto a six-inch silicon wafer (Fujimi Electronics Industry Co., Ltd., thickness 625±25 μm) using a sputtering device (L-440S-FHL type, produced by Canon Anelva Co.). Thereafter, a negative photosensitive resin composition prepared by a method described later was spin-coated on this wafer using a coater developer (D-Spin60A type, produced by SOKUDO Co., Ltd.), and prebaked on a hot plate at 110° C. for 180 seconds to form a coating film having a thickness of approximately 7 μm. This coating film was irradiated using a test patterned mask with an energy of 500 mJ/cm$^2$ with a Peiam GHI (produced by Ultratech Co.). The coating was then spray-developed with a coating developer (D-Spin60A type, produced by SOKUDO) using cyclopentanone as a developer, and rinsed with propylene glycol methyl ether acetate to obtain a relief pattern on Cu. The wafer on which the relief pattern on Cu was formed was subjected to heat treatment for 2 hours at the curing temperatures described in Table 1 using a temperature-increasing programmed curing furnace (VF-2000 type, produced by Koyo Lindberg, Co.) under a nitrogen atmosphere to obtain a cured relief pattern consisting of a resin having a thickness of approximately 4 to 5 μm thick on Cu.

(3) Resolution Evaluation of Cured Relief Pattern on Cu

The cured relief pattern obtained by the above method was observed under an optical microscope to determine the minimum openings pattern size. At this time, if the area of the openings of the obtained pattern was one-half or more of the corresponding pattern mask opening area, it was considered to be resolved, and the length of the mask opening side corresponding to the one having the smallest area among the resolved openings was defined as the resolution. Those having a resolution of less than 10 μm were defined as "excellent", those having a resolution of 10 μm to less than 14 μm were defined as "good", those having a resolution of 14 μm to less than 18 μm were defined as "OK", and those having a resolution of 18 μm or more were defined as "poor."

(4) High Temperature Storage Evaluation of Cured Relief Pattern on Cu and Subsequent Cu Surface Void Area Evaluation The wafer on which the cured relief pattern on Cu was formed was heated for 168 hours at 150° C. in air using a temperature-increasing programmed curing furnace (VF-2000 type, Koyo Lindberg Co.). Subsequently, the entire resin layer on the Cu was removed by plasma etching using a plasma surface treatment device (EXAM type, produced by Shinko Seiki Co., Ltd.). The conditions of the etching conditions were as follows.

Output: 133 W

Types and Flow Rates: $O_2$: 40 mL/min+$CF_4$: 1 mL/min.

Gas Pressure: 50 Pa

Mode: Hard mode

Etching time: 1800 seconds

The Cu surface obtained by fully removing the resin layer was observed using an FE-SEM (S-4800 type, produced by Hitachi High-Technologies, Ltd.), and the area of voids occupying the surface of the Cu layer was calculated using image analysis software (A-zo-kun, produced by Asahi Kasei Co.). When the total area of voids at the time of evaluation of the negative photosensitive resin composition described in Comparative Example 1 was 100%, those having a total area ratio of voids of less than 50% were determined to be "excellent", those having a total area ratio of 50% to less than 75% were determined to be "good", those having a total area ratio of 75% to less than 100% were determined to be "OK", and those having a total area ratio of 100% or more were determined to be "poor."

(5) Evaluation of Chemical Resistance of Cured Relief Pattern (Polyimide Coating)

The cured reliefpattern formed on Cu was immersed for 5 minutes in a resist stripping solution {ATMI Co., product name ST-44, main components: 2-(2-aminoethoxy)ethanol, 1-cyclohexyl-2-pyrrolidone}which had been heated to 50° C., washed with running water for 1 minute, and air-dried. Thereafter, the film surface was visually observed with an optical microscope, and the chemical resistance was evaluated in accordance with the presence or absence of damage due to the chemical solution, such as cracks, or the rate of change in the film thickness after the chemical solution process. As evaluation criterion, those in which cracks or the like did not occur and the film thickness change rate was 10% or less based on the film thickness before the chemical immersion were defined as "excellent", those in which the film thickness was more than 10% to 15% were defined as "good", those in which the film thickness was more than 15% to 20% were defined as "OK", and those in which cracks occurred or those in which the film thickness change rate was more than 20% were defined as "poor."

(6) Evaluation of Adhesion with Sealing Material

As an epoxy-based sealing material, the product named R4000 series produced by Nagase Chemtex Co., Ltd. was prepared. The sealing material was spin-coated onto an aluminum sputtered silicon wafer so as to have a thickness of approximately 150 microns, and heat-cured at 130° C., thereby curing the epoxy-based sealing material. On the above epoxy-based cured film, the photosensitive resin composition prepared in each of the Examples and the Comparative Examples was applied so as to have a final film thickness of 10 microns. The entire surface of the applied photosensitive resin composition was exposed with a high-line of an exposure amount of 600 mJ/cm$^2$ using an aligner (PLA-501F, produced by Canon Co., Ltd.). Thereafter, the cured film was thermally cured at 180° C. for 2 hours to prepare a first layer having a thickness of 10 microns.

A photosensitive resin composition used in forming a cured film of the first layer was applied onto the cured film of the first layer, and the entire surface thereof was exposed under the same conditions as in the preparation of the cured film of the first layer, and then thermally cured to prepare a cured film of the second layer having a thickness of 10 microns. A pin was placed on a sample prepared in the sealing material deterioration evaluation, and an adhesion test was performed using a drawing evaluation machine (produced by Quad Group Co., Ltd., Sebastian Type 5). Specifically, the adhesive strength between the epoxy-based sealing material and the cured relief pattern composed of the photosensitive resin composition prepared in each of the Examples and Comparative Examples was measured and evaluated based on the following criteria.

| | |
|---|---|
| Evaluation: Adhesion strength 70 MPa or more... | Adhesion strength A |
| Adhesion strength 50 MPa to less than 70 MPa... | Adhesion strength B |
| Adhesion strength 30 MPa to less than 50 MPa... | Adhesion strength C |
| Adhesion strength less than 30 MPa | Adhesion strength D |

Preparation Example 1: Synthesis of Polymer A-1 as (A) Polyimide Precursor 155.1 g of 4,4'-oxydiphthalic dianhydride (ODPA) was placed in a 2 L volume separable flask, 131.2 g of 2-hydroxylethylmethacrylate (HEMA) and 400 mL of γ-butyrolactone were charged. The mixture was stirred at room temperature. 81.5 g of pyridine was added thereto while stirring to obtain a reaction mixture. After the completion of heating due to the reaction, the reaction mixture was allowed to cool to room temperature and allowed to stand for 16 hours. Next, under ice cooling, a solution of 206.3 g of dicyclohexylcarbodiimide (DCC) dissolved in 180 mL of γ-butyrolactone was added to the reaction mixture over 40 minutes while stirring, followed by the addition of 93.0 g of 4,4'-oxydianiline (ODA) suspended in 350 mL of γ-butyrolactone over 60 minutes while stirring. After additional stirring for 2 hours at room temperature, 30 mL of ethyl alcohol was added thereto and the mixture was stirred for 1 hour, and 400 mL of γ-butyrolactone was the added thereto. The precipitate formed in the reaction mixture was removed by filtration to obtain a reaction solution. The resulting reactant was added to 3 L of ethyl alcohol to produce a precipitate consisting of crude polymer. The obtained crude polymer produced was filtered off and dissolved in 1.5 L of tetrahydrofuran to obtain a crude polymer solution. The obtained crude polymer solution was added dropwise to 28 L of water to precipitate the polymer, and the obtained precipitate was filtered, followed by vacuum drying to obtain a powdery polymer (Polymer A-1). When the molecular weight of the polymer (A-1) was measured by gel permeation chromatography (standard polystyrene conversion), the weight average molecular weight (Mw) was 20,000.

Preparation Example 2: Synthesis of Polymer A-2 as (A) Polyimide Precursor

The reaction was carried out in the same manner as in the method described in Production Example 1 described above, except that 147.1 g of 3,3',4,4'-biphenyltetracarboxylic dianhydride (BPDA) was used in place of the 155.1 g of 4,4'-oxydiphthalic dianhydride (ODPA) of Production Example 1 to obtain polymer (A-2). When the molecular weight of the polymer (A-2) was measured by gel permeation chromatography (standard polystyrene conversion), the weight average molecular weight (Mw) was 22,000.

Preparation Example 3: Synthesis of Polymer A-3 as (A) Polyimide Precursor

The reaction was carried out in the same manner as in the method described in Preparation Example 1 described above, except that 98.6 g of 2,2'-dimethylbiphenyl-4,4'-diamine (m-TB) was used in place of the 93.0 g of the 4,4'-oxydianiline (ODA) of Preparation Example 1 to obtain polymer (A-3). When the molecular weight of the polymer (A-3) was measured by gel permeation chromatography (standard polystyrene conversion), the weight average molecular weight (Mw) was 21,000.

Preparation Example 4: Synthesis of Polymer A-4 as (A) Polyimide Precursor

The reaction was carried out in the same manner as in the method described in Preparation Example 1 described above, except that p-phenylenediamine (50.3 g) was used in place of the 4,4'-oxydianiline (ODA) of Preparation Example 1 to obtain a polymer (A-3). When the molecular weight of the polymer (A-3) was measured by gel permeation chromatography (standard polystyrene conversion), the weight average molecular weight (Mw) was 18,000.

Example 1 MOI-D (Compound B-1) Production Method 55.1 g (0.25 mol) of diethylene glycolbis(3-aminopropyl) ether was charged into a 500 mL volume separable flask, and 150 mL of tetrahydrofuran was charged. The mixture was stirred at room temperature. Next, under ice cooling, a solution obtained by adding 150 mL of tetrahydrofuran to 77.6 g (0.50 mol) of 2-methacryloyloxyethyl isocyanate (produced by Showa Denko Co., Ltd., product name: Calends MOI) was added dropwise into the above flask over 30 minutes, and the mixture was stirred at room temperature for 5 hours. Thereafter, the tetrahydrofuran was distilled off using a rotary evaporator to obtain Compound B-1. The methacrylic equivalent of Compound B-1 was 265 g/mol.

Example 2 MOI-AP (Compound B-2) Production Method

Synthesis was carried out in the same manner as in Example 1, except that the 55.1 g of diethylene glycolbis (3-aminopropyl)ether of Example 1 described above was replaced with 51.1 g (0.25 mol) of 1,4-butanediolbis(3-aminopropyl ether) to obtain Compound B-2. The methacrylic equivalent of Compound B-2 was 257 g/mol.

Example 3 MOI-ODA (Compound B-3) Production Method

Synthesis was carried out in the same manner as in Example 1, except that the 55.1 g of diethylene glycolbis (3-aminopropyl)ether of Example 1 described above was replaced with 50.1 g (0.25 mol) of ODA to obtain Compound B-3. The methacrylic equivalent of Compound B-3 was 255 g/mol.

Example 4 MOI-DEtA (Compound B-4) Production Method

Synthesis was carried out in the same manner as in Example 1, except the 55.1 g of diethylene glycolbis(3-aminopropyl)ether of Example 1 described above was replaced with 26.3 g (0.25 mol) of diethanolamine and the 77.6 g of the 2-methacryloyloxyethyl isocyanate (produced by Showa Denko Co., Ltd., product name: Calends MOI) was replaced with 38.8 g (0.25 mol) thereof to obtain Compound B-4. The methacrylic equivalent of Compound B-4 was 260 g/mol.

Example 5 MOI-EG-MOI (Compound B-5) Production Method

Synthesis was carried out in the same manner as in Example 1, except that the 77.6 g of 2-methacryloyloxyethyl isocyanate (produced by Showa Denko Co., Ltd., product name: Calends MOI) of Example 1 described above was replaced with 99.6 g (0.50 mol) of 2-(2-isocyanatoethyloxy) ethyl methacrylate to obtain Compound B-5. The methacrylic equivalent of Compound B-5 was 309 g/mol.

Example 6 MOI-DEA (Compound B-6) Production Method 55.1 g (0.25 mol) of N-phenyldiethanolamine was charged into a 500 mL tri-neck recovery flask, and 100 mL of propylene glycol monomethyl ether acetate was added to the flask. The mixture was stirred at room temperature. Further, 150 mL of propylene glycol monomethyl ether acetate was added to 77.6 g (0.50 mol) of 2-methacryloyloxyethyl isocyanate (Showa Denko Co., Ltd., product name: Calends MOI). The flask was then heated to 120° C. in an oil bath, and after stirring at 120° C. for 13 hours, cooled to room temperature. Thereafter, the propylene glycol monomethyl ether acetate was distilled off using a rotary evaporator to obtain Compound B-6. The methacrylic equivalent of Compound B-6 was 245 g/mol.

Example 7 MOI-AEE (Compound B-7) Production Method

Synthesis was carried out in the same manner as in Example 1, except that the 55.1 g of diethylene glycolbis(3-aminopropyl)ether of the Preparation Example 5 described above was replaced with 26.3 g (0.25 mol) of 2-(2-aminoethoxy)ethanol, and the 77.6 g of 2-methacryloyloxyethyl isocyanate (produced by Showa Denko Co., Ltd., product name: Calends MOI) was replaced with 38.8 g (0.25 mol) thereof to obtain Compound B-7. The methacrylic equivalent of Compound B-7 was 260 g/mol.

Example 8 MOI-DOA (Compound B-8) Production Method

Synthesis was carried out in the same manner as in Example 1, except that the 55.1 g of diethylene glycolbis(3-aminopropyl)ether of Example 1 described above was replaced with 60.4 g (0.25 mol) of di-n-octylamine, and the 77.6 g of 2-methacryloyloxyethyl isocyanate (produced by Showa Denko Co., Ltd., product name: Calends MOI) was replaced with 38.8 g (0.25 mol) thereof to obtain Compound B-8. The methacrylic equivalent of Compound B-8 was 397 g/mol.

Example 9 BEI-DEtA (Compound B-9) Production Method 26.3 g (0.25 mol) of diethanolamine was charged into a 500 mL volume separable flask, and 150 mL of tetrahydrofuran was charged. The mixture was stirred at room temperature. Next, under ice cooling, a solution obtained by adding 150 mL of tetrahydrofuran to 59.8 g (0.25 mol) of 1,1-(bisacryloyloxymethyl)ethyl isocyanate (produced by Showa Denko Co., Ltd., product name: Calends BEI) was added dropwise to the above flask over 30 minutes, and the mixture was stirred at room temperature for 5 hours. Thereafter, the tetrahydrofuran was distilled off using a rotary evaporator to obtain Compound B-9. The acrylic equivalent of Compound B-9 was 172 g/mol.

Example 10 BEI-BHEA (Compound B-10) Production Method

Synthesis was carried out in the same manner as in Example 9, except that the 26.3 g (0.25 mol) of diethanolamine of Example 9 described above was replaced with 37.1 g (0.25 mol) of N,N'-bis(2-hydroxyethyl)ethylenediamine and the 59.8 g (0.25 mol) of 1,1-(bisacryloyloxymethyl)ethylisocyanate was replaced with 119.6 g (0.50 mol) thereof to obtain compound B-10. The acrylic equivalent of the compound B-10 was 157 g/mol.

Example 11 (Compound B-11)

2.10 g (0.020 mol) of diethanolamine was charged into a 100 mL volume tri-neck flask, and 5.6 g of tetrahydrofuran was charged. The mixture was stirred at room temperature. Next, under ice-cooling, a solution obtained by adding 2.67 g (0.021 mol) of hexylisocyanate to 5.6 g of tetrahydrofuran was added dropwise into the above flask over 15 minutes, and the mixture was stirred at room temperature for 4 hours. Thereafter, the tetrahydrofuran was distilled off using a rotary evaporator to obtain compound B-11.

Example 12 (Compound B-12)

Synthesis was carried out in the same manner as in Example 11, except that the 2.10 g (0.020 mol) of diethanolamine of Example 11 described above was replaced with 2.10 g (0.020 mol) of 2-(2-aminoethoxy)ethanol to obtain Compound B-12.

Example 13 (Compound B-13)

Synthesis was carried out in the same manner as in Example 11, except that the 2.10 g (0.020 mol) of diethanolamine of Example 11 described above was replaced with 2.66 g (0.020 mol) of bis(2-methoxyethyl)amine to obtain Compound B-13.

Example 14

A negative photosensitive resin composition was prepared by the following method using Polymer A-1, and evaluation of the prepared composition was performed. 100 g of polymer A-1 as the (A) polyimide precursor, 8 g of Compound B-1 of Example 1 as the (B) compound, and 3 g of ethanone 1-[9-ethyl-6-(2-methylbenzoyl)-9H-carbazol-3-yl]-1-(O-acetyloxime) (OXE-02, corresponding to photosensitizer C-1) as the (C) photopolymerization initiator were dissolved in 150 g of γ-butyl lactone (GBL). The viscosity of the obtained solution was adjusted to approximately 30 poise by further adding a small amount of GBL to obtain a negative photosensitive resin composition. The composition was evaluated in accordance with the methods described above. The results are shown in Table 1.

Examples 15 to 26

Negative photosensitive resin compositions were prepared in the same manner as Example 14 except that they were prepared at the mixing ratios shown in Table 1. The compositions were evaluated in accordance with the methods described above. The results are shown in Table 1.

Example 27

A negative photosensitive resin composition was prepared by the following method using Polymers A-1 and A-2, and evaluation of the prepared composition was performed. 50 g of polymer A-1 and 50 g of polymer A-2 as the (A) polyimide precursor, 8 g of Compound B-1 as the (B) compound, and 3 g of ethanone 1-[9-ethyl-6-(2-methylbenzoyl)-9H-carbazol-3-yl]-1-(O-acetyloxime) (OXE-02, corresponding to photosensitizer C-1) as the (C) photopolymerization initiator were dissolved in 150 g of γ-butyllactone (GBL). The viscosity of the obtained solution was adjusted to approximately 30 poise by further adding a small amount of GBL to obtain a negative photosensitive resin composition. The composition was evaluated in accordance with the methods described above. The results are shown in Table 2.

Examples 28 to 36

Negative photosensitive resin compositions were prepared in the same manner as Example 14 except that they were prepared at the mixing ratios shown in Table 2. The compositions were evaluated in accordance with the methods described above. The results are shown in Table 1.

Example 37

A negative photosensitive resin composition was prepared by the following method using polymer A-3, and evaluation of the prepared composition was performed. 100 g of polymer A-3 as the (A) polyimide precursor, 8 g of Compound B-1 as the (B) compound, and 3 g of ethanone 1-[9-ethyl-6-(2-methylbenzoyl)-9H-carbazol-3-yl]-1-(O-acetyloxime) (OXE-02, corresponding to photosensitizer C-1) as the (C) photopolymerization initiator were dissolved in 150 g of γ-butyl lactone (GBL). The viscosity of the obtained solution was adjusted to approximately 30 poise by further adding a small amount of GBL to a obtain negative photosensitive resin composition. The composition was evaluated in accordance with the methods described above. The results are shown in Table 2.

Example 38

A negative photosensitive resin composition was produced in the same manner as in Example 24, except that Polymer A-4 was used instead of Polymer A-3, and evaluated according to the aforementioned methods. The results are shown in Table 2.

Comparative Example 1

A negative photosensitive resin composition was produced in the same manner as in Example 1, except that the (B) compound was not used, and evaluated according to the aforementioned methods. The results are shown in Table 2.

As described in Table 1, Compounds (B-1 to B-13) and photosensitive agents (C-1) correspond to the following compounds, respectively.

B-1
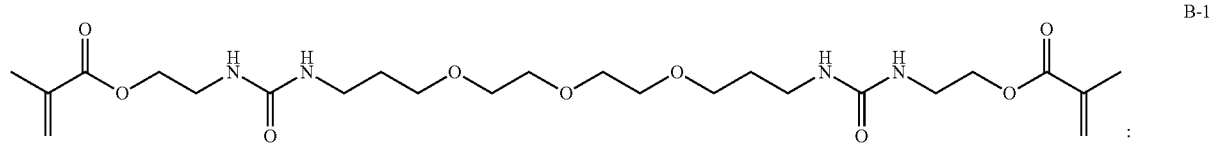

B-2
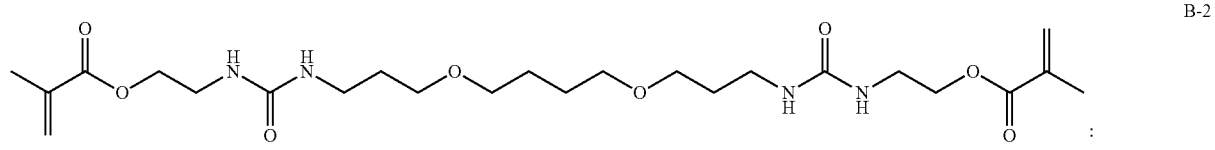

B-3
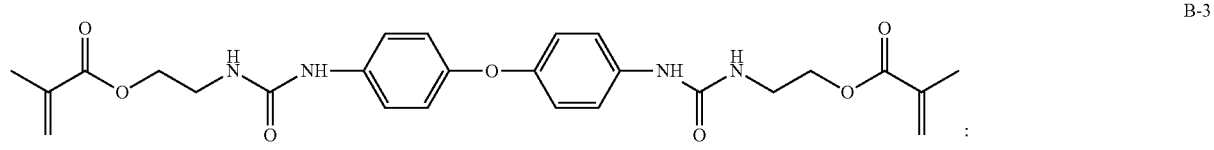

B-4

B-5
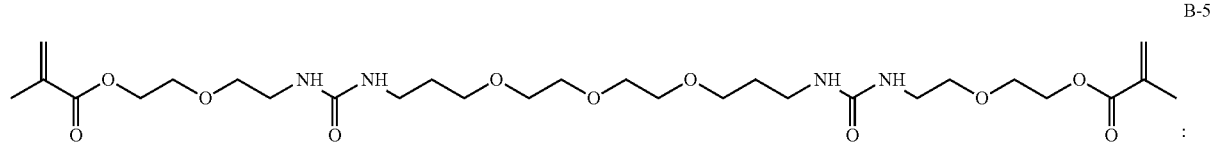

-continued
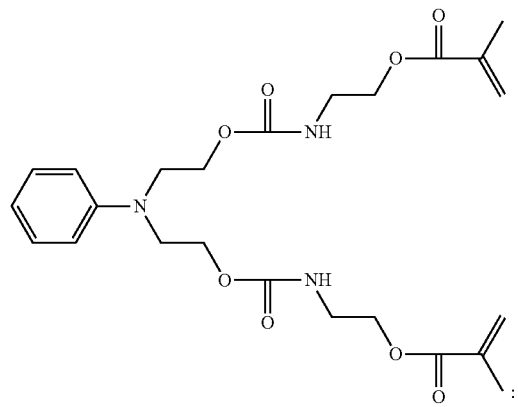
B-6
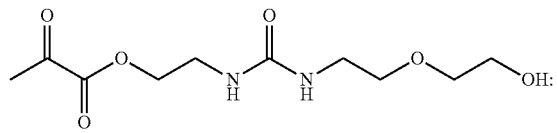
B-7
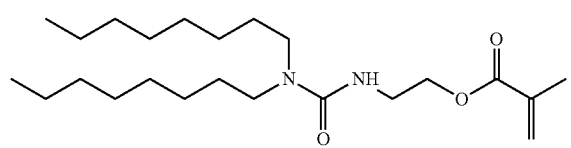
B-8
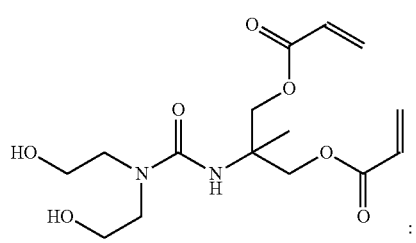
B-9
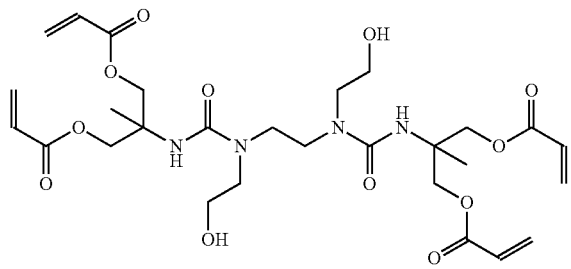
B-10
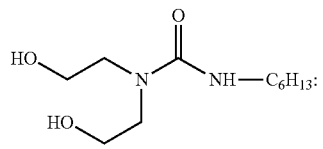
B-11
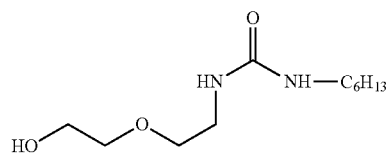
B-12
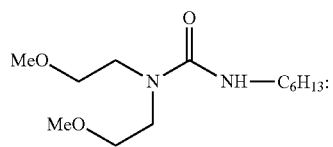
B-13
C-1: Ethanone 1-[9-ethyl-6-(2-methylbenzoyl)-carbazol-3-yl]-1-(O-acetyloxime) (Product Name: IRGACURE OXE-02 (OXE-02))
TABLE 1
| | | Ex. 14 | Ex. 15 | Ex. 16 | Ex. 17 | Ex. 18 | Ex. 19 | Ex. 20 | Ex. 21 | Ex. 22 | Ex. 23 | Ex. 24 | Ex. 25 | Ex. 26 |
|---|---|---|---|---|---|---|---|---|---|---|---|---|---|---|
| Polymer | A-1 | 100 | 100 | 100 | 100 | 100 | 100 | 100 | 100 | 100 | 100 | 100 | 100 | 100 |
| | A-2 | | | | | | | | | | | | | |
| | A-3 | | | | | | | | | | | | | |
| | A-4 | | | | | | | | | | | | | |
| Compound | B-1 | 8 | | | | | | | | | | | | |
| | B-2 | | 8 | | | | | | | | | | | |
| | B-3 | | | 8 | | | | | | | | | | |
| | B-4 | | | | 8 | | | | | | | | | |
| | B-5 | | | | | 8 | | | | | | | | |
| | B-6 | | | | | | 8 | | | | | | | |
| | B-7 | | | | | | | 8 | | | | | | |
| | B-8 | | | | | | | | 8 | | | | | |

TABLE 1-continued

|  |  | Ex. 14 | Ex. 15 | Ex. 16 | Ex. 17 | Ex. 18 | Ex. 19 | Ex. 20 | Ex. 21 | Ex. 22 | Ex. 23 | Ex. 24 | Ex. 25 | Ex. 26 |
|---|---|---|---|---|---|---|---|---|---|---|---|---|---|---|
|  | B-9 |  |  |  |  |  |  |  |  | 8 |  |  |  |  |
|  | B-10 |  |  |  |  |  |  |  |  |  | 8 |  |  |  |
|  | B-11 |  |  |  |  |  |  |  |  |  |  | 8 |  |  |
|  | B-12 |  |  |  |  |  |  |  |  |  |  |  | 8 |  |
|  | B-13 |  |  |  |  |  |  |  |  |  |  |  |  | 8 |
| Photosensitizer | C-1 | 3 | 3 | 3 | 3 | 3 | 3 | 3 | 3 | 3 | 3 | 3 | 3 | 3 |
| Curing Temp. (° C.) |  | 180 | 180 | 180 | 180 | 180 | 180 | 180 | 180 | 180 | 180 | 180 | 180 | 180 |
| Cu Surface Void Area Evaluation |  | Good | Good | OK | Good | OK | OK | Good | Good | Good | Good | Good | Good | Good |
| Resolution Evaluation |  | Good | Good | Good | Good | OK | Good | Good | OK | OK | OK | OK | OK | OK |
| Chemical Resistance Evaluation |  | Good | Good | OK | Good | OK | OK | Good | Good | Good | Good | Good | Good | OK |
| Evaluation of Adhesion with Encapsulant |  | B | B | C | A | B | C | A | C | A | A | A | A | B |

(unit: g)

TABLE 2

|  |  | Ex. 27 | Ex. 28 | Ex. 29 | Ex. 30 | Ex. 31 | Ex. 32 | Ex. 33 | Ex. 34 | Ex. 35 | Ex. 36 | Ex. 37 | Ex. 38 | Comp. Ex. 1 |
|---|---|---|---|---|---|---|---|---|---|---|---|---|---|---|
| Polymer | A-1 | 50 | 50 | 50 | 50 | 50 | 50 | 50 | 50 | 50 | 50 |  |  | 100 |
|  | A-2 | 50 | 50 | 50 | 50 | 50 | 50 | 50 | 50 | 50 | 50 |  |  |  |
|  | A-3 |  |  |  |  |  |  |  |  |  |  | 100 |  |  |
|  | A-4 |  |  |  |  |  |  |  |  |  |  |  | 100 |  |
| Compound | B-1 | 8 |  |  |  |  |  |  |  |  |  | 8 | 8 |  |
|  | B-2 |  | 8 |  |  |  |  |  |  |  |  |  |  |  |
|  | B-3 |  |  | 8 |  |  |  |  |  |  |  |  |  |  |
|  | B-4 |  |  |  | 8 |  |  |  |  |  |  |  |  |  |
|  | B-5 |  |  |  |  | 8 |  |  |  |  |  |  |  |  |
|  | B-6 |  |  |  |  |  | 8 |  |  |  |  |  |  |  |
|  | B-7 |  |  |  |  |  |  | 8 |  |  |  |  |  |  |
|  | B-8 |  |  |  |  |  |  |  | 8 |  |  |  |  |  |
|  | B-9 |  |  |  |  |  |  |  |  | 8 |  |  |  |  |
|  | B-10 |  |  |  |  |  |  |  |  |  | 8 |  |  |  |
|  | B-11 |  |  |  |  |  |  |  |  |  |  |  |  |  |
|  | B-12 |  |  |  |  |  |  |  |  |  |  |  |  |  |
|  | B-13 |  |  |  |  |  |  |  |  |  |  |  |  |  |
| Photosensitizer | C-1 | 3 | 3 | 3 | 3 | 3 | 3 | 3 | 3 | 3 | 3 | 3 | 3 | 3 |
| Curing Temp. (° C.) |  | 180 | 180 | 180 | 180 | 180 | 180 | 180 | 180 | 180 | 180 | 180 | 180 | 180 |
| Cu Surface Void Area Evaluation |  | Exc | Exc | Good | Exc | Good | Good | Exc | Exc | Exc | Good | Good | Good | Poor |
| Resolution Evaluation |  | Exc | Exc | Good | Exc | Good | Good | Exc | Good | Exc | Exc | Exc | Exc | Poor |
| Chemical Resistance Evaluation |  | Good | Good | Good | Exc | Good | OK | Exc | Exc | Exc | Good | Good | Good | Poor |
| Evaluation of Adhesion with Encapsulant |  | B | B | C | A | B | C | A | C | A | A | B | B | D |

(unit: g)

INDUSTRIAL APPLICABILITY

By using the negative photosensitive resin composition according to the present invention, a cured relief pattern having high chemical resistance and resolution can be obtained, and void generation on the surface of Cu can be suppressed. The present invention can be suitably used, for example, in the field of photosensitive materials and is useful for producing electrical and electronic materials of semiconductor devices and multilayer wiring substrates.

The invention claimed is:

1. A negative photosensitive resin composition, comprising:

(A) a polyimide precursor represented by general formula (1) below, (B) a compound having at least one selected from a urethane bond and a urea bond, wherein the (B) compound further has a (meth)acrylic group, and a (meth)acrylic equivalent weight of 150 g/mol to 330 g/mol, and (C) a photopolymerization initiator:

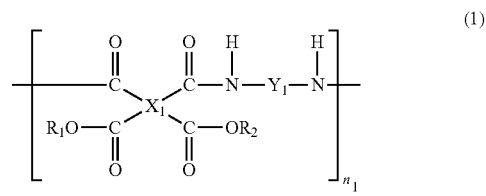

where $X_1$ is a tetravalent organic group, $Y_1$ is a divalent organic group, $n_1$ is an integer of 2 to 150, $R_1$ and $R_2$ are each independently a hydrogen atom or a monovalent organic group, and at least one of $R_1$ and $R_2$ is a monovalent organic group represented by general formula (2) below:

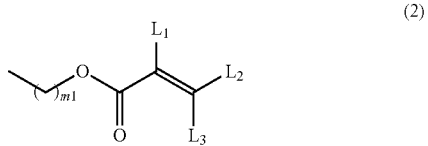
(2)

where $L_1$, $L_2$, and $L_3$ are each independently a hydrogen atom or a $C_{1-3}$ organic group, and $m_1$ is an integer of 2 to 10;

wherein the (B) compound contains a structure represented by general formula (3) below:

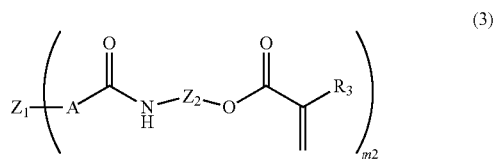
(3)

where $R_3$ is a hydrogen atom or methyl group, A is a group selected from the group consisting of —O—, —NH—, and —NL$_4$-, $L_4$ is a $C_{1-12}$ monovalent organic group, $Z_1$ is a $C_{2-24}$ organic group having a valency of $m_2$ and comprising one or more hetero atoms, $Z_2$ is a $C_{2-8}$ divalent organic group, and $m_2$ is an integer of 1 to 3.

2. The negative photosensitive resin composition according to claim 1, wherein the (B) compound is a compound having a (meth)acrylic group and a urea bond.

3. The negative photosensitive resin composition according to claim 1, wherein the (B) compound further has at least one functional group selected from a hydroxyl group, alkoxy group, and amino group.

4. The negative photosensitive resin composition according to claim 1, wherein the (B) compound is a compound having a (meth)acrylic group and a urea bond, and the (meth)acrylic equivalent thereof is 150 to 330 g/mol.

5. The negative photosensitive resin composition according to claim 1, wherein the (B) compound is a compound having a (meth)acrylic group and a urea bond, and the (meth)acrylic equivalent thereof is 210 to 330 g/mol.

6. The negative photosensitive resin composition according to claim 1, wherein the (B) compound is a compound having a (meth)acrylic group and a urea bond, and the (meth)acrylic equivalent thereof is 220 to 330 g/mol.

7. The negative photosensitive resin composition according to claim 1, wherein the (B) compound is at least one compound selected from the group consisting of general formulas (4) to (7), (11), (13), and (14) below:

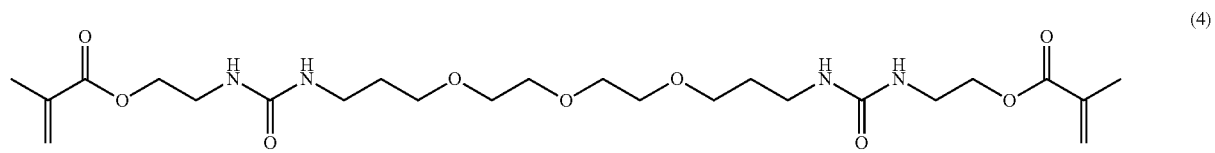
(4)

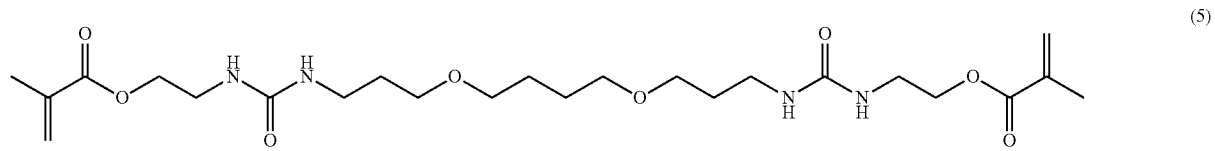
(5)

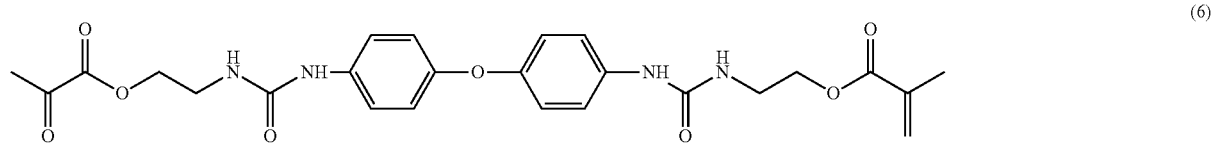
(6)

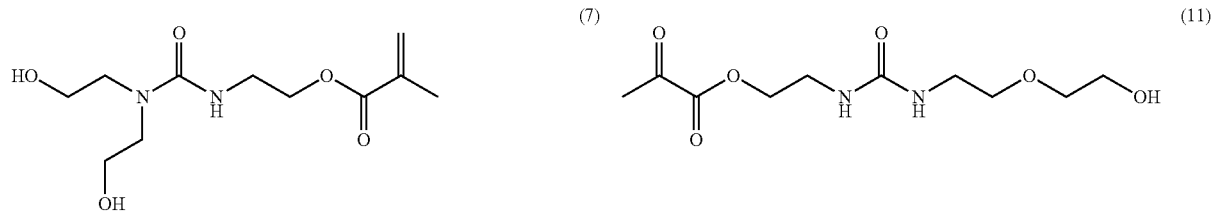
(7) (11)

(13)
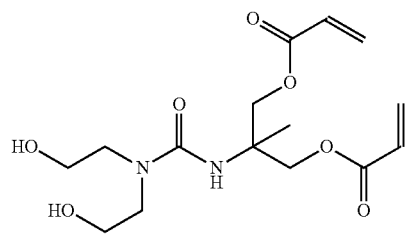

(14)
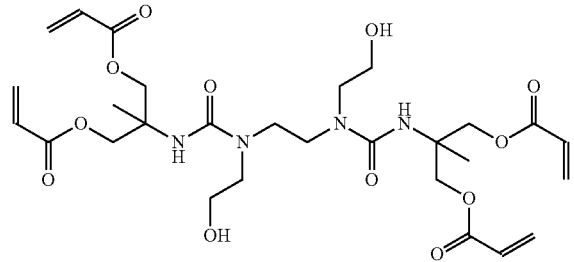

8. The negative photosensitive resin composition according to claim 1, further comprising (D) a corrosion inhibitor.

9. The negative photosensitive resin composition according to claim 8, wherein the (D) corrosion inhibitor contains a nitrogen-containing heterocyclic compound.

10. The negative photosensitive resin composition according to claim 9, wherein the nitrogen-containing heterocyclic compound is an azole compound.

11. The negative photosensitive resin composition according to claim 9, wherein the nitrogen-containing heterocyclic compound is a purine derivative.

12. The negative photosensitive resin composition according to claim 1, further comprising (E) a silane coupling agent.

13. The negative photosensitive resin composition according to claim 1, wherein $X_1$ of the (A) polyimide precursor contains at least one selected from the group consisting of general formulas (20a), (20b), and (20c) below:

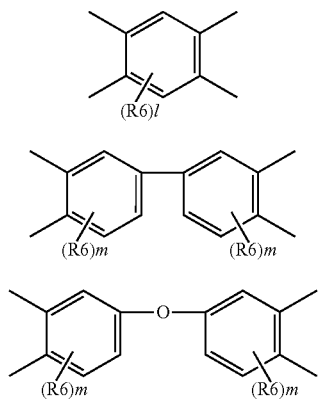

where $R_6$ are each independently a monovalent group selected from the group consisting of a hydrogen atom, fluorine atom, $C_{1-10}$ hydrocarbon group, and $C_{1-10}$ fluorine-containing hydrocarbon group, l is an integer selected from 0 to 2, and m is an integer selected from 0 to 3.

14. The negative photosensitive resin composition according to claim 1, wherein $Y_1$ of the (A) polyimide precursor contains at least one selected from the group consisting of general formulas (21a), (21b), and (21c) below:

(21a)
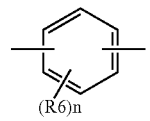

(21b)
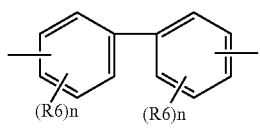

(21c)
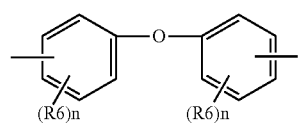

where $R_6$ are each independently a monovalent group selected from the group consisting of a hydrogen atom, fluorine atom, $C_{1-10}$ hydrocarbon group, and $C_{1-10}$ fluorine-containing hydrocarbon group, and n is an integer selected from 0 to 4.

15. The negative photosensitive resin composition according to claim 1, wherein the (A) polyimide precursor comprises a polyimide precursor having a structural unit represented by general formula (8) below:

(8)
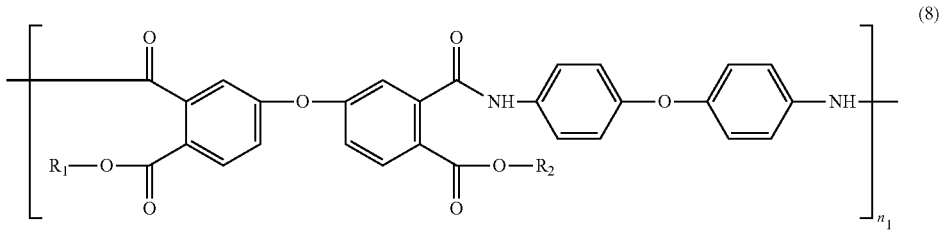

where $n_1$ is an integer of 2 to 150 and $R_1$ and $R_2$ are each independently a hydrogen atom or a monovalent group.

16. The negative photosensitive resin composition according to claim 1, wherein the (A) polyimide precursor comprises a polyimide precursor having a structural unit represented by general formula (9) below:

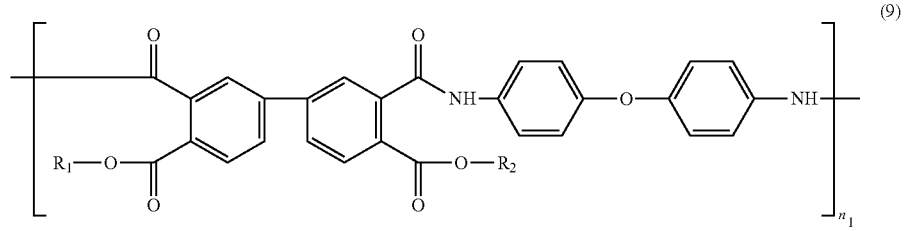

where $n_1$ is an integer of 2 to 150, and $R_1$ and $R_2$ are each independently a hydrogen atom or a monovalent organic group.

17. The negative photosensitive resin composition according to claim 1, wherein the (A) polyimide precursor is a copolymer of a structural unit represented by general formula (8) below:

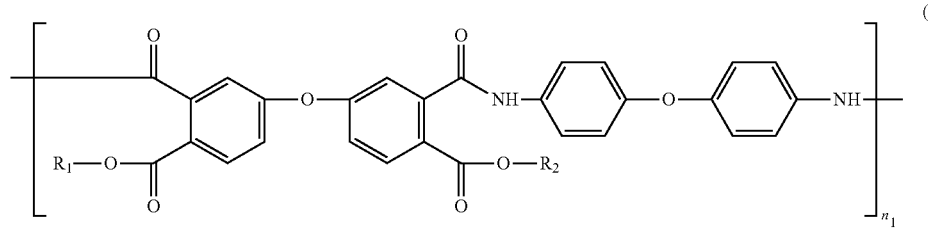

where $n_1$ is an integer of 2 to 150 and $R_1$ and $R_2$ are each independently a hydrogen atom or a monovalent organic group, and $R_1$, $R_2$, and $n_1$ may be the same as or different than $R_1$, $R_2$, and $n_1$ of general formula (9), and a structural unit represented by general formula (9) below:

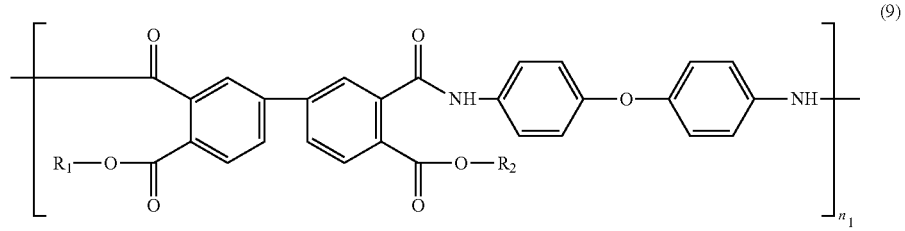

where $n_1$ is an integer of 2 to 150 and $R_1$ and $R_2$ are each independently a hydrogen atom or a monovalent organic group, and $R_1$, $R_2$, and $n_1$ may be the same as or different than $R_1$, $R_2$, and $n_1$ of general formula (8), or a mixture of a polyimide precursor having a structural unit represented by general formula (8) above, and a polyimide precursor having a structural unit represented by general formula (9) above.

18. The negative photosensitive resin composition according to claim 17, wherein the (A) polyimide precursor is a copolymer of a structural unit represented by general formula (8) above and a structural unit represented by general formula (9) above.

19. The negative photosensitive resin composition according to claim 1, comprising:

100 parts by weight of the (A) polyimide precursor, 0.1 to 30 parts by weight of the (B) compound relative to 100 parts by weight of the (A) polyimide precursor, and 0.1 to 20 parts by weight of the (C) photopolymerization initiator relative to 100 parts by weight of the (A) polyimide precursor.

20. A method for the production of a polyimide, comprising converting the negative photosensitive resin composition according to claim 1 into a polyimide.

21. A method for the production of a cured relief pattern, comprising:
(1) applying the negative photosensitive resin composition according to claim 1 onto a substrate to form a photosensitive resin layer on the substrate,
(2) exposing the photosensitive resin layer,
(3) developing the exposed photosensitive resin layer to form a relief pattern, and
(4) heat-treating the relief pattern to form a cured relief pattern.

22. A compound represented by formula (5) below:

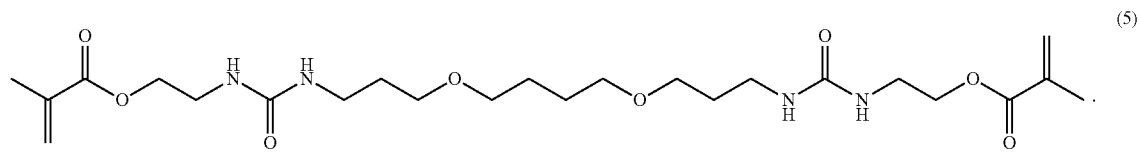 [SMILES: C=C(C)C(=O)OCCNC(=O)NCCCOCCCCOCCCNC(=O)NCCOC(=O)C(=C)C]

(5)

23. A compound represented by formula (6) below:

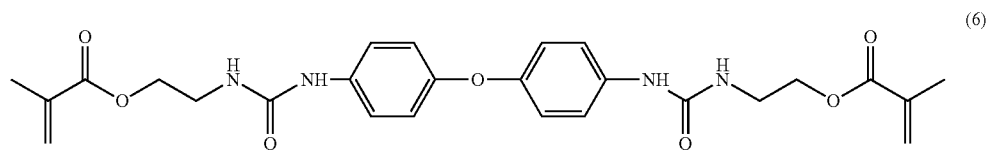 [SMILES: C=C(C)C(=O)OCCNC(=O)Nc1ccc(Oc2ccc(NC(=O)NCCOC(=O)C(=C)C)cc2)cc1]

(6)

24. A compound represented by formula (11) below:

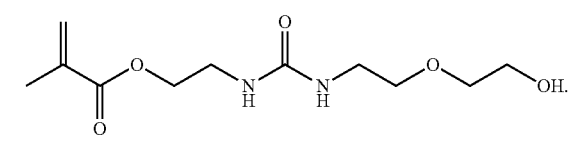

(11)

25. A composition comprising: a compound represented by formula (13) below, and a solvent selected from the group consisting of N-methyl-2-pyrrolidone, dimethyl sulfoxide, tetramethyl urea, butyl acetate, ethyl lactate, γ-butyrolactone, propylene glycol monomethyl ether acetate, propylene glycol monomethyl ether, diethylene glycol dimethyl ether, benzyl alcohol, phenyl glycol, and tetrahydrofurfuryl alcohol:

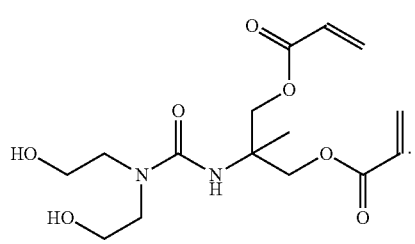

(13)

26. A compound represented by formula (14) below:

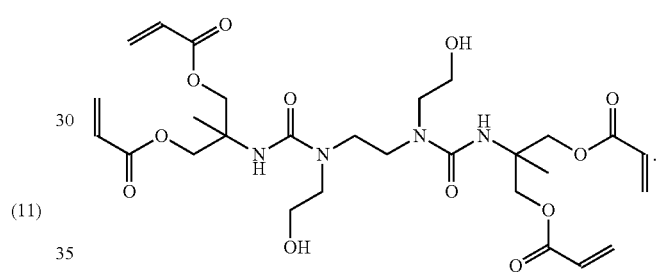

(14)

27. A composition comprising: a compound represented by formula (7) below, and a thermal polymerization inhibitor:

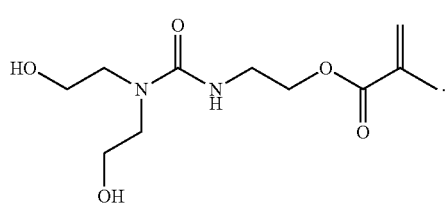

(7)

28. A composition comprising: a compound represented by formula (7) below, and a photopolymerization initiator:

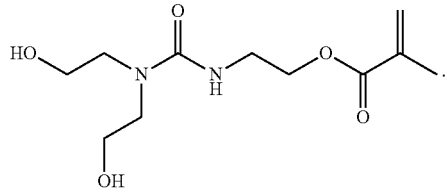

(7)

29. A composition comprising: a compound represented by formula (13) below, and a thermal polymerization inhibitor:

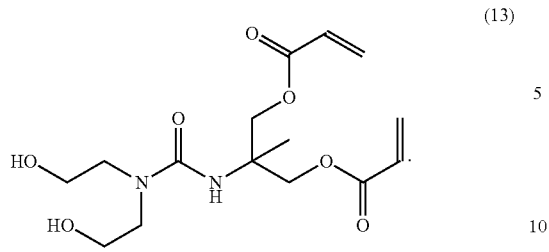
(13)
30. A composition comprising: a compound represented by formula (13) below, and a photopolymerization initiator:
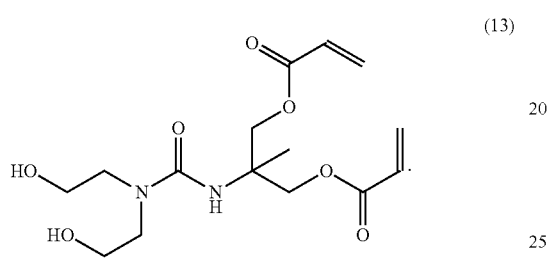
(13)
* * * * *